US012631682B2

(12) United States Patent
Cummings et al.

(10) Patent No.: US 12,631,682 B2
(45) Date of Patent: May 19, 2026

(54) TWO-PHASE HELIUM CONVECTION LOOP FOR CRYOGENIC COOLING

(71) Applicant: Massachusetts Institute of Technology, Cambridge, MA (US)

(72) Inventors: John Cummings, Stoneham, MA (US); George Haldeman, Lexington, MA (US); Lawrence Narkewich, West Roxbury, MA (US); Sergey K. Tolpygo, Waltham, MA (US); John Ingwersen, Portsmouth, NH (US)

(73) Assignee: Massachusetts Institute of Technology, Cambridge, MA (US)

( * ) Notice: Subject to any disclaimer, the term of this patent is extended or adjusted under 35 U.S.C. 154(b) by 1070 days.

(21) Appl. No.: 17/721,639

(22) Filed: Apr. 15, 2022

(65) Prior Publication Data
US 2025/0224441 A1      Jul. 10, 2025

Related U.S. Application Data

(60) Provisional application No. 63/175,808, filed on Apr. 16, 2021.

(51) Int. Cl.
*G01R 31/28* (2006.01)

(52) U.S. Cl.
CPC ................................ *G01R 31/2877* (2013.01)

(58) Field of Classification Search
CPC .................................................. G01R 31/2877
See application file for complete search history.

(56) References Cited

U.S. PATENT DOCUMENTS

| | | | |
|---|---|---|---|
| 2008/0100313 A1* | 5/2008 | Shinohara | H05F 3/02 324/750.19 |
| 2010/0307642 A1* | 12/2010 | Palumbo | C25D 3/38 148/400 |
| 2011/0198817 A1* | 8/2011 | Hurley | H01L 21/67144 279/3 |
| 2014/0262157 A1* | 9/2014 | Citver | H01J 37/3171 165/104.21 |
| 2016/0178716 A1* | 6/2016 | Lvovsky | H01F 6/04 324/318 |

(Continued)

OTHER PUBLICATIONS

Daughton et al.; "WR-5.1 band, on-wafer characterization at cryogenic temperatures"; Proceedings of the 45th European Microwave Conference; EuMA, Sep. 2015; 4 Pages.

(Continued)

*Primary Examiner* — Dominic E Hawkins
(74) *Attorney, Agent, or Firm* — Daly, Crowley, Mofford & Durkee, LLP

(57) ABSTRACT

Described is a probing system and technique for testing superconducting and low-temperature circuitry at the wafer level. In embodiments, the system includes a helium convection loop such as a passive helium convection loop. The use of a passive helium convection loop enables the use of welded flexible bellows hoses. Also described is a wafer holding structure having a fixed portion configured to be removably secured to a wafer to be tested and a second portion configured to be removably secured to the fixed portion and configured to remain in a testing chamber portion of a wafer probing system and configured to provide force application and alignment functionality to a wafer to be tested.

20 Claims, 17 Drawing Sheets

Two Thermal Stage System    100

(56) References Cited

U.S. PATENT DOCUMENTS

| | | | |
|---|---|---|---|
| 2020/0124641 A1* | 4/2020 | Oota | G01R 1/07314 |
| 2020/0309153 A1* | 10/2020 | Miller | F04D 29/5813 |
| 2021/0190857 A1* | 6/2021 | Kim | G01R 31/2867 |
| 2023/0003791 A1* | 1/2023 | McCusker | G01R 31/2862 |

OTHER PUBLICATIONS

Desai et al.; "Thermodynamic Properties of Iron and Silicon"; Journal of Physical Chemical Reference Data; vol. 15, No. 3; Jul. 1986; 17 Pages.

DiPirro et al.; "A Liquid Helium Film Heat Pipe/Heat Switch"; Advances in Cryogenic Engineering; vol. 43; Plenum Press; 1998; 8 Pages.

Fried et al.; "Interface Thermal Conductance in a Vacuum"; Journal of Spacecraft and Rockets; vol. 2, No. 4; Engineering Notes; Jul.-Aug. 1965; 3 Pages.

Glassbrenner et al.; "Thermal Conductivity of Silicon and Germanium from 3K to the Melting Point"; Physical Review; vol. 134, No. 4A; May 18, 1964; 12 Pages.

Mehta et al.; "Review of Parametric Investigation of Cryogenic Heat Pipe"; International Journal of Recent Technology and Engineering (IJRTE); vol. 3, Issue 2; May 2014; 4 Pages.

Russell et al.; "Cryogenic probe station for on-watfer characterization of electrical devices"; Review of Scientific Instruments; 83, 044703; 2012; DOI: 10.1063/1.3700213; 11 Pages.

Sakurai et al.; "Mechanism of Nucleate Boiling on a Solid Surface in Liquid Helium I"; Advances in Cryogenic Engineering; vol. 39; Plenum Press; 1994; 10 Pages.

Taylor et al.; "An Efficient Cooling Loop for Connecting Cryocooler to a Helium Reservoir"; AIP Conference Proceedings; vol. 710, No. 1; American Institute of Physics; Jul. 2004; 8 Pages.

* cited by examiner

370

Helium Convection Loop
(See Fig. 2A)

Condenser

372

374

376

Load Lock Chamber
360

Wafer Loading Actuator
(See Figs. 3A, 3B)

362

Condensor
358

Helium Supply

Condensor
358

Return Line (See FIG. 3B)

Wafer Loading Actuator

Wafer Loading Controller

Motor

75

Silicon Wafer Carrier
72

69c

69b

69a

Loading Fork
67

Roller block

Clamp actuator lever

Clamp Plate

Parallel bar linkage

Wafer Holding Surface

Clamp Plate

Latch actuator link

Latch actuator hooks (shown floating)

Evaporator heat sinks w/ pre-loaded contact springs

Latch actuator hooks (shown floating)

Latch closed

Latch open

Clamp open              Clamp actuator
                       lever engaged

Clamp open

TWO-PHASE HELIUM CONVECTION LOOP FOR CRYOGENIC COOLING

CROSS REFERENCE TO RELATED APPLICATIONS

This application claims the benefit of U.S. Provisional Application 63/175,808, filed Apr. 16, 2021, the entire contents of which are incorporated by reference herein.

STATEMENT REGARDING FEDERALLY SPONSORED RESEARCH

This invention was made with government support under FA8702-15-D-0001 awarded by the U.S. Air Force. The government has certain rights in the invention.

BACKGROUND

As is known in the art, there is a desire to test superconducting and low-temperature circuitry (electronic, optical, electro-mechanical, etc.) at the wafer level.

Such testing is difficult for several reasons including: difficulties in cooling both a wafer under test and wafer-testing probes to the same temperature and maintaining a flat wafer geometry in a low-pressure or vacuum environment to interface with a wafer testing-probe.

SUMMARY

Described is a probing system suitable for a number of testing applications including but not limited to testing superconducting and low-temperature circuitry at the wafer level.

In accordance with one aspect of the concepts, systems, structures and techniques disclosed herein, described is a system for testing superconducting and low-temperature circuitry at the wafer level comprising means for utilizing helium exchange gas.

In accordance with another aspect of the concepts, systems, structures and techniques disclosed herein, described is a probing system and technique for testing superconducting and low-temperature circuitry at the wafer level. In embodiments, the system includes a helium convection loop such as a passive helium convection loop. The use of a passive helium convection loop enables the use of welded flexible bellows hoses.

In accordance with a further aspect of the concepts, systems, structures and techniques disclosed herein, described is a method and structure for loading wafers in a system for testing superconducting and low-temperature circuitry at the wafer level which comprising helium exchange gas means. Such method and structure maintain a flat wafer geometry in a low-pressure or vacuum environment to interface with probe tips.

In accordance with a still further aspect of the concepts, systems, structures and techniques disclosed herein, described is a method and structure for pressurizing a prober chamber in a system for testing superconducting and low-temperature circuitry at the wafer level comprising helium exchange gas means.

In an embodiment, a system for testing superconducting and low-temperature circuitry includes a first (or outer) chamber and a second (or inner) chamber disposed in the first chamber. Both chambers are vacuum-tight. A probe station is disposed in the second (inner) chamber. In embodiments, the inner chamber can also hold an internal pressure against an external vacuum and in operation is maintained at a temperature less than five degrees Kelvin (<5° K). The inner chamber is provided having a high thermal conductivity characteristic, exhibiting in excess of 100 W/m K at room temperature, and being composed largely of high purity metal. In embodiments, the inner chamber may comprise aluminum. In embodiments, the inner chamber may comprise copper. In preferred embodiments, the inner chamber has an enhanced low-temperature thermal conductivity characteristic in the temperature region from about 20° K to about 60° K. This inner chamber is thus a pressure-sealed and radiation-shielded enclosure. In embodiments, a helium thermal exchange gas may be used to increase conductance. In embodiments, the wafer stage operates at temperature below 10° K. In embodiments in which a helium thermal exchange gas is used, the stage will operate at liquid helium temperatures, below 5° K. In embodiments, all electric wiring that penetrates the inner chamber is "thermalized" with respect to the inner chamber wall by bringing it into a physical contact so that heat flowing down the wiring is shunted to the structure.

In embodiments, a system for testing superconducting and low-temperature circuitry comprises a combination of actively and passively cooled heat shields. In embodiments, the shields are well-matched to current pulse tube cryo-cooler designs.

For the purpose of heat-sinking wafers under test, a back side of a wafer under test is in thermal contact with a heat-sinking structure. In embodiments, a force is applied to a front side of the wafer under test. In embodiments, a compressive force is applied to a front side of the wafer under test. In embodiments, a compressive force may be applied to a front side of the wafer under test if the wafer is clamped to the holder. It should be noted that this front side is also where the circuitry to be tested is located. Therefore, in embodiments, solid contact (i.e., physical contact) is only applied at the edge of the wafer where no circuitry is located.

In conventional testing systems, gas pressure operating against an evacuated holder or electrostatic attraction between the wafer and the holder may be used to provide this compressive contact force to the wafer under test. Such a pressurization technique, however, will not work in a vacuum or at very low ambient pressures.

On accordance with one aspect of the concepts described herein, it has been recognized that when testing a wafer in a vacuum or at very low ambient pressures, by using a conventional solid edge contact approach from the front side of the wafer to secure the wafer under test to a wafer holder (i.e. a wafer clamping approach), an undesirable wafer heat sinking arrangement can occur. Specifically, if a wafer clamping approach is used when testing a wafer in a vacuum or at very low ambient pressures, heat sinking can primarily occur near an edge of the wafer, or in more central regions of the wafer that are held in compression due to wafer bending.

Thus, in accordance with one aspect of the concepts described herein, described is a wafer holding structure for use in a wafer probing system having a first portion configured to fix (i.e. removably secure, or rigidly attach) a wafer to be tested in a known or one-time measurable coordinate frame and having a second portion which provides sufficient heat sinking (also referred to herein as "thermalization") of the circuitry on the wafer and any additional parasitic heat loads during wafer testing. It should be appreciated that, in a vacuum, thermal contact resistance between two contacting objects is related (and in some cases, highly related), to a force (pressure) applied to the contact area.

It should be noted that another purpose of the wafer holding structure described herein is for use in a high-throughput or automatic probing system. To enable or facilitate use in a high-throughput or automatic probing system, the wafer holding structure described herein may further comprise a mechanism for automatically aligning a wafer to a holder, applying a required force (e.g., pressure), and then removing that force and the wafer upon completion of the wafer testing.

Conventional wafer holders that also perform a wafer alignment function are often referred to as wafer chucks (or more simply "chucks"). In conventional systems, conventional chucks can operate by utilizing gas pressure or electrostatic attraction, with valves and switches to control the force application and can also use mechanical edge force through actuated mechanisms. Chucks can operate in coordination with automatic manipulators that position and then remove the wafer after testing is complete.

The amount of force that can be applied from the front side of a wafer is inherently limited by the bending stresses in the wafer. If the required force is just to hold or otherwise secure the wafer in place, this force may be low enough such that little or no wafer bending is required. In this case, the small area (typically <10% of total wafer area) available for solid contact at the wafer edge on the front surface may be sufficient to meet the force requirements (typically ~10× the wafer weight).

In conventional, non-vacuum, room-temperature wafer probing, this force may also be sufficient to provide heat-sinking for the wafer circuits under test and any parasitic heat flows into the system, particularly if the wafer is also held in contact by means of an evacuated holder and surrounded by a thermally conductive gas medium.

In accordance with the concepts disclosed herein, it has, however, been recognized that in vacuum applications larger edge forces are required and adequate heat sinking of circuitry located on the wafer interior may not be possible to achieve using conventional approaches due to limited in-plane thermal conductance associated with thin wafer structures. It has also been recognized that if the force required to hold and heat sink the wafer is so large that it is not possible to provide by front side contact from the wafer edge without fracturing the wafer or is limited by the environment and in-plane thermal conductance, then it is not possible to hold and heat sink the wafer by application of such force. It has also been recognized that if the required wafer-holding and heat sinking force is in an intermediate region (i.e. between a force less than the maximum allowable bending stresses in the wafer and a force which is so large that it is not possible to hold the wafer without fracturing the wafer) then the force may require a significant deformation in the wafer either forcing a curved surface (which is much more complicated than applying force from the front side by gas pressure) or pre-deformation of the wafer (which causes difficulties in and generally makes more complicated the wafer growing process).

Thus, in accordance with one aspect of the concepts described herein, described is a wafer holding structure constructed or otherwise configured to work in cryogenic and vacuum environments. In embodiments, the wafer holding structure comprises two parts: (1) a first portion (also sometime referred to hereon as a "first part," a "fixed part" a "wafer holder assembly" or a "wafer holder") configured to be removably secured (or "fixed") to a wafer to be tested; and (2) a second portion (also sometimes referred to herein as a "second part" or a "chuck") that remains with the probing system (e.g. is configured to remain in a testing chamber portion of a probing system) and that provides force application and alignment functionality. In embodiments the force application and alignment functionality provided by the second portion of the wafer holding structure is needed for automatic wafer probing. In embodiments, the wafer holder may be constructed from a material having a coefficient of thermal expansion (CTE) which matches or substantially matches a CTE of a wafer to be tested (e.g., which matches the CTE of a substrate material of the wafer to be tested). In embodiments, the wafer holder may be constructed from or otherwise comprise a material single crystal silicon to match (or substantially match) the coefficient of thermal expansion (CTE) of a wafer substrate material. In other embodiments, the wafer holder may be constructed from or otherwise comprise a single crystal germanium or other matched CTE materials. In embodiments, a wafer may be removably secured to (e.g., temporarily attached to) the wafer holder using cryogenic rated vacuum grease which will provide sufficient mechanical and thermal contact. In other embodiments, the wafer may be removably secured to (e.g., temporarily attached to) with adhesives or fluids. In embodiments, the second portion (i.e the chuck portion of the wafer holding structure) may comprise copper, aluminum, or other metals. In embodiments, the chuck portion may be thermally coupled to a probing structure by thermal straps to provide additional heat-sinking in a vacuum environment. In embodiments, multiple metals and other materials may be used to fabricate, assemble or otherwise construct at least the chuck portion of the wafer holding structure to provide both high thermal conductivity and adequate structural rigidity and alignment where needed.

In accordance with one aspect of the concepts described herein, described is a first portion of a wafer holding structure configured to locate and heat sink a wafer under test in automatic probing applications. In embodiments, a first portion of a wafer holding structure comprises a core configured to be in and which enables mechanical and thermal contact with a wafer to be tested without transverse deformation during wafer probing and testing (as would happen if the wafer to be tested were probed without this structure). In embodiments, the core may be provided from a material selected to enhance in-plane thermal conductance for wafers in thermal contact with a surface of the wafer holder. Further, the material from which the core is provided is provided having a thickness selected to enhance in-plane thermal conductance for wafers in thermal contact with a surface of the wafer holder. In embodiments, the core is provided having a width to thickness ratio <10 in at least one dimension. In embodiments, the material from which the first portion of the wafer holding structure is provided comprises a thermally conductive material. In embodiments, the material from which the first portion of the wafer holding structure is a metal. In embodiments, the first portion of the wafer holding structure comprises a metal core. In embodiments, the metal core comprises copper and/or aluminum. In embodiments, a first portion of a wafer holding structure provided in accordance with the concepts described herein may comprise a metal core substantially consisting of copper and/or aluminum. In embodiments, a first portion of a wafer holding structure may comprise a single crystal silicon wafer holding structure. Other manufacturable materials, may of course, also be used, providing the materials have adequate thermal and mechanical properties (i.e., materials having thermal and mechanical characteristics sufficient to allow the first portion of a wafer holding structure to function as intended—i.e. to perform wafer holding and heat sinking functions while allowing for automatic insertion, alignment, and removal of the wafer during testing—may be used). In embodiments, the first portion of a wafer holding structure may comprise alignment and clamping features.

Such a first portion of a wafer holding structure (with the first portion also sometimes referred to herein below simply as a "wafer holder") may be fabricated using any techniques known to those of ordinary skill in the art.

As noted above, chucks used for automatic wafer probing perform wafer holding functions while allowing for automatic insertion, alignment, and removal of a wafer during testing. For wafer probing at temperatures other than room temperature, the wafer to be tested must come to thermal equilibrium with the chuck after insertion of the wafer and the chuck in a test chamber. Application of the wafer clamping force prior to the wafer coming to thermal equilibrium may induce thermal stresses that could damage the thin wafer or affect the measurements taken during circuit testing once the wafer does come to thermal equilibrium. The amount of stress is related to the total change in wafer temperature and the difference between the coefficients of thermal expansion (CTEs) of the wafer and the chuck. Consequently, for semiconductor crystal wafers and ordinary metal chucks, as typically constructed, the potential for large stresses exists when probing at cryogenic temperatures less than 100° K. Thus, by providing a wafer holding structure comprising two separable portions—i.e. a first portion (also sometimes referred to herein as a "wafer holding portion," a "wafer carrier" or a "wafer holder") and a second portion (also sometime referred to herein as a "chuck portion"), it is possible to thermalize the wafer to be tested and the wafer holding portion without regards to the temperature of the chuck portion of the wafer holding structure.

Furthermore, as also noted above, by appropriate selection of materials, the chuck portion of the wafer holding structure used for automatic wafer probing within a vacuum environment also provides adequate in-plane thermal conductance to heat-sink probed circuits on the wafer under test.

In accordance with a still further aspect of the concepts described herein, in embodiments a chuck heat strap comprises a helium convection loop such as a passive helium convection loop. The use of a passive helium convection loop enables the use of bellows hoses. Such bellows hoses may be coupled to other structures by welding or other means at ends thereof. Such bellows hoses have a greater compliance (or flexibility) characteristic than conventional thermal straps of equivalent performance made from copper or aluminum braid or foil.

In alternate embodiments, a properly sized thermal strap (e.g., a properly sized conventional thermal strap) may be used rather than a passive helium convection loop.

In embodiments which utilize an exchange gas, the passive helium convection loop structure and technique may provide a reliable backup cooling approach.

In embodiments, a cooler structure comprises first and second stages, and a two-phase helium convection loop coupled to the second ($2^{nd}$) stage of the cooler. Such an approach provides thermal performance which is improved relative to the thermal performance achievable with a conventional thermal strap.

In embodiments, the helium convection loop comprises flex lines which may pass through feedthrough structures, e.g., through one or more existing feedthrough structures. In embodiments, the system comprises integrated heat exchangers disposed to act as a condenser and an evaporator. In embodiments, the condenser may be bolted directly to the second stage and may eliminate the need for the traditional thermal straps that are used to cool the inner chamber structure. The evaporator may be integrated into the chuck design and clamped or otherwise secured to the wafer holder. In embodiments, the evaporator may be secured to the wafer holder through a pre-form as part of a chuck loading procedure. For example, in embodiments, the evaporator may be secured to a silicon wafer holder through an indium pre-form as part of a chuck loading procedure.

The system includes a number of features, including, but not limited to: a CTE matched, single crystal silicon wafer holder; a 4° K cryogenic load valve; a cryogenic magnetometer and readout electronics; a stage actuated, high-force clamping wafer chuck design; and chuck-integrated, helium convection loop components as described above.

With respect to the helium convection loop, this approach is an improvement over semi rigid or solid heat-conductive thermal straps and in at least some embodiments, utilizes flexible welded bellows and a cold head. Furthermore, the helium convection loop described herein uses additional components beyond hard tubes and a cold mounted condenser including, but not limited to: a remote helium evaporator mounted at a cooled load; flexible bellows tubing, e.g., flexible stainless steel bellows tubing, to allow relative motion between the condenser and the cooled evaporator on the load. The helium convection loop described herein is an improvement over solid thermal straps for applications operating near liquid helium temperatures and results in one or more of: improved effective thermal conductance for a given stiffness and weight; temperature monitoring and control via system pressure; and enhanced isolation from mechanical vibration associated with the commercial coolers. Furthermore, with the helium convection loop architecture described herein, performance is relatively insensitive to actual distance between the cooler and cooled load.

In embodiments the system may include: a single heat pipe (versus a two-pipe convection loop); and/or expansion reservoirs. In embodiments, helium pressures can be extended to the supercritical regime to extend performance to temperatures above normal liquid helium. In other embodiments alternate pure liquids may be used for a wider temperature range.

DESCRIPTION OF THE SEVERAL VIEWS OF THE DRAWINGS

The manner and process of making and using the disclosed embodiments may be appreciated by reference to the figures of the accompanying drawings. It should be appreciated that the components and structures illustrated in the figures are not necessarily to scale, emphasis instead being placed upon illustrating the principals of the concepts described herein. Like reference numerals designate corresponding parts throughout the different views. Furthermore, embodiments are illustrated by way of example and not limitation in the figures, in which.

DETAILED DESCRIPTION

Figure 1A:
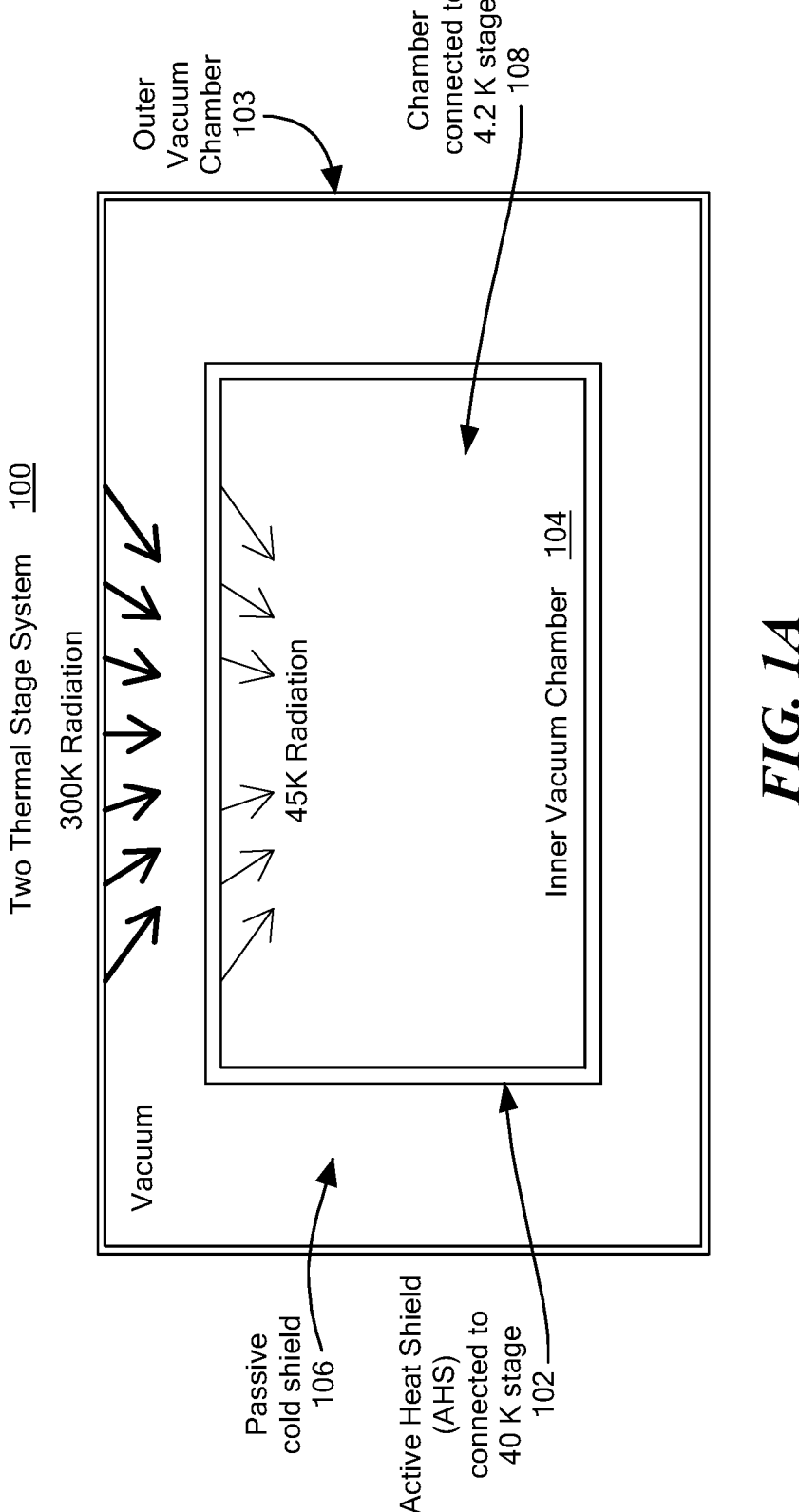
FIG. 1A is a block diagram of a system for testing superconducting and low-temperature circuitry having two actively cooled thermal stages and a helium exchange gas.

Referring now to FIG. 1A, a system for testing superconducting and low-temperature circuitry having two actively-cooled thermal stages includes an active heat shield (AHS) connected to a cooled end of a higher temperature cooling stage (also sometimes referred to as "first stage" or "$1^{st}$ stage") and an inner vacuum chamber (IVC) coupled to the cooled end of a lower temperature cooling stage (also sometimes referred to as a "second stage" or a "2nd stage"). This two-stage architecture matches available commercial cryogenic coolers.

In embodiments, the first stage is configured to operate near 40° K and actively cools a primary radiation heat shield, the AHS, for the system. In embodiments, an additional uncooled heat shield may be configured between the outer vacuum chamber and the AHS to provide additional shielding from radiative heat transport. Additional, passive and active heat shields may, of course, be used to reduce the parasitic heat leak into the system. In embodiments, the second stage is configured to operate at or below liquid helium temperatures, i.e., temperatures at or about 4.2 K at normal atmospheric pressure. In embodiments, the IVC is a vacuum-tight chamber and may be maintained at a temperature of less than about 5 K (<5K). The IVC is configured to accept a helium thermal exchange gas. Thus, a helium thermal exchange gas may be introduced into the IVC to increase the thermal conductance of the components disposed therein. A wafer probing station is incorporated into the IVC, which has a 4-axis mechanical wafer positioning stage, also sometimes referred to as a "testing stage" or a "wafer stage," disposed therein. This mechanical positioning stage is not related to the two active thermal stages shown in FIG. 1A.

With the two actively cooled thermal stages, the active heat shield (AHS, stage 1) is disposed about the inner vacuum chamber (IVC, stage 2) and an intermediate passive heat shield is disposed about the AHS. The outer vacuum chamber (OVC) is disposed about the passive heat shield, and provides vacuum insulation for the enclosed components, as well as a low radiation boundary at room temperature. The system of FIG. 1A thus includes a combination of actively and passively cooled shields which, in embodiments, may be well-matched to current pulse tube cryocooler designs. The wafer stage is thus disposed in a high thermal conductivity, radiation-shielded enclosure and must be capable of operating at liquid helium temperatures because, as noted above, the second stage may be maintained at a temperature of less than about 5° K.

In embodiments, the active cold shield is coupled to a ~40° K stage and the inner vacuum chamber is coupled to ~4.2° K stage.

As will be described further below, all electric wiring is thermalized to the first ($1^{st}$) and second ($2^{nd}$) stages.

Figure 1B:
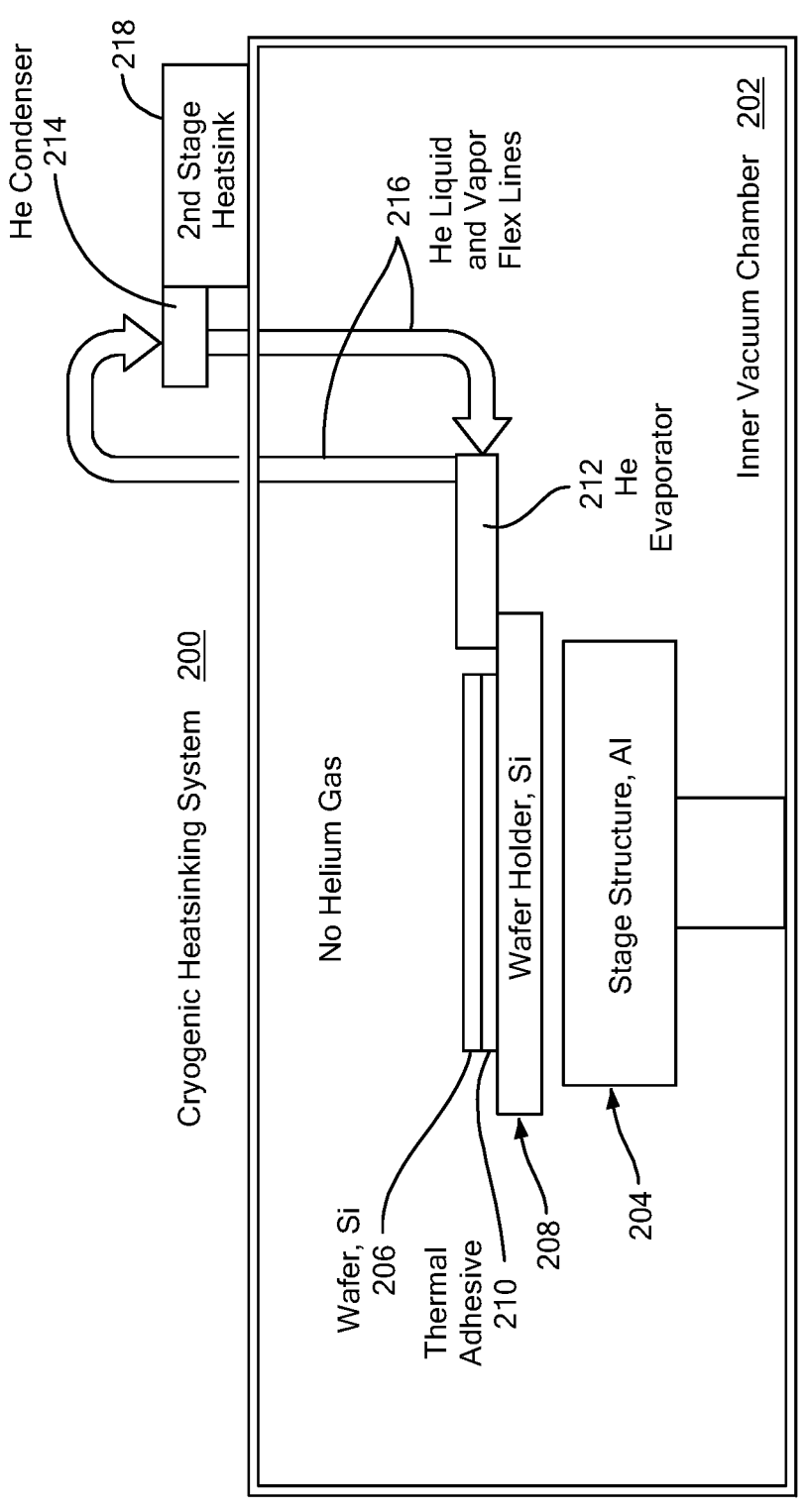
FIG. 1B is a block diagram illustrating a cryogenic heatsinking system that can operate with or without a helium exchange gas.

Referring now to FIG. 1B, a cryogenic heatsinking system includes a cryogenically cooled chamber, IVC in the embodiment described above, having a wafer stage disposed therein. The wafer stage is configured to hold a wafer, e.g., a semiconductor or dielectric wafer such as a wafer comprising any Group II-VI or Group II-V materials including but not limited to silicon, germanium, quartz, sapphire, diamond, or any other material now known or later discovered. In embodiments, the wafer stage comprises a positioning stage structure having a wafer holder, or combined wafer holder and wafer chuck, disposed thereon. A thermal adhesive may be applied or otherwise disposed on a surface of the wafer holder and a wafer is disposed over and in contact with the thermal adhesive. In embodiments, the thermal adhesive can be cryogenically rated vacuum grease or other cryogenically rated adhesives. In embodiments, the wafer holder is mounted to the stage with a wafer chuck.

The wafer holder is provided from a material having a coefficient of thermal expansion (CTE) which is substantially matched to the wafer disposed thereon, i.e., the wafer under test. With this arrangement, an appropriate thermal adhesive (i.e. a thermal adhesive that maintains structural integrity and solid state thermal conductivity when cooled to operating temperatures) can be used without inducing excessive stress upon cooling, and a thermal path exists between the wafer and the wafer holder. In these embodiments, the thermal adhesive comprises a very thin layer, i.e. al layer having a thickness which is much less than (or much thinner than) a thickness of the wafer to be tested. Further, the thermal adhesive exhibits low elastic modulus as compared to the wafer and wafer holder.

In other embodiments using a helium exchange gas, to promote this thermal conduction path, it may be desirable to clamp the wafer to the holder and provide a wafer holder clamping force. It should be noted that without helium (He) exchange gas there is no effective thermal path from the wafer to any structure other than the wafer holder unless there is an additional structure thermally coupled directly to the wafer holder. Thus, to provide an effective thermal path in the absence of exchange gas, a helium convection loop may be thermally coupled to the wafer holder, and a thermal adhesive or other thermal gap filler may be used to provide heatsinking at the center of the wafer. In embodiments, part of the wafer holder system is provided by a separate, actuated chuck assembly. In embodiments, the convection loop heatsink can be clamped to either side of the wafer holder and can be incorporated into the actuated chuck assembly.

In embodiments, the helium (He) convection loop comprises a He evaporator disposed within the inner vacuum chamber and a He condenser disposed external to the IVC. He liquid and vapor inside flexible lines (a/k/a "(flex lines") and associated piping are both in fluid communication between the He evaporator and condenser. In embodiments, the helium convection loop comprises stainless flex lines, vacuum feedthroughs, and hard piping coupled between the He evaporator and the He condenser through which He liquid and vapor move. In embodiments, the He evaporator is disposed proximate the wafer and the wafer holder, forms the convection loop heatsink, and is clamped in contact with at least one surface of the wafer holder.

Figure 1C:
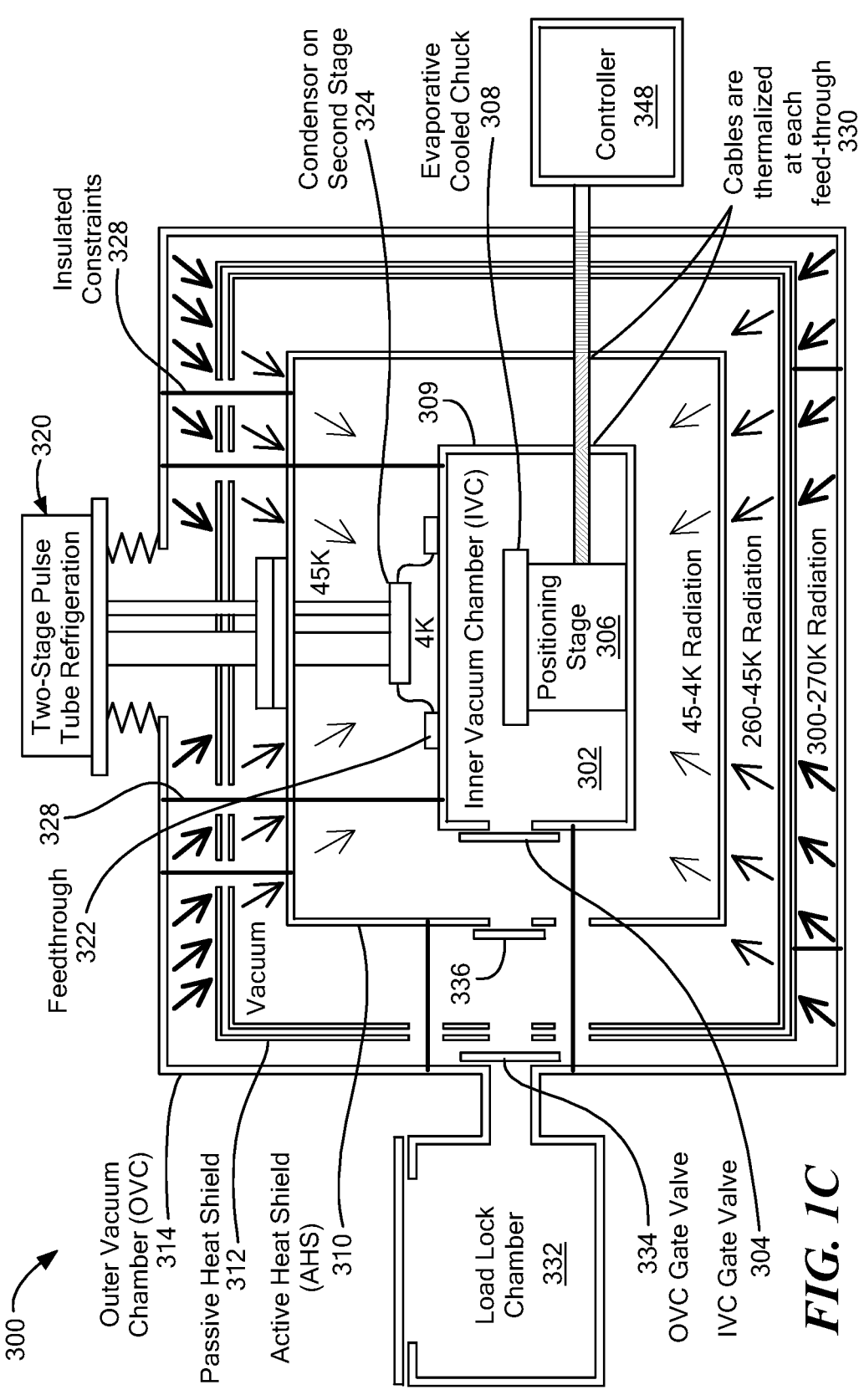
FIG. 1C is a block diagram of a cryogenic system for semi-automatic wafer probing which includes the two-stage and cryogenic heatsinking systems and uses an inner vacuum chamber having flexible lines disposed therein, a helium convection loop, and an outer vacuum chamber.

Referring now to FIG. 1C, a complete wafer testing system includes an inner vacuum chamber (IVC) having IVC gate valve. Disposed within the IVC is a positioning stage (shown) and fixed wafer probing electrical hardware, also sometimes referred to herein as a "probe station" (not shown for clarity). A helium evaporator cooled chuck is also disposed within the IVC and is coupled to the positioning stage. An active heat shield (AHS) is disposed about the IVC. A passive heat shield (PHS) is disposed about the AHS and an outer vacuum chamber (OVC) is disposed about the AHS. A two-stage pulse tube refrigeration unit is coupled through the OVC, PHS, and AHS. The IVC, AHS, PHS, OVC and two-stage pulse tube refrigeration unit are configured such that a vacuum may be formed within all spaces internal to the OVC.

Each of the OVC, PHS, AHS and IVC comprise vacuum tight openings to allow for loading of wafers from outside the OVC. The vacuum tight openings, accordingly, incorporate gate valves, e.g., an OVC gate valve and IVC gate valve. In addition, the active heat shield has a spring-loaded cover to maintain the heat shield integrity after loading of a wafer to be tested. These openings lead to an external, separate wafer loading chamber (also sometimes referred to as a "load lock chamber"). This load lock chamber has an independent vacuum system. In operation, a specimen, e.g., a mounted wafer and wafer holder assembly (to be described in detail below), is disposed in the load lock chamber; the chamber is closed, locked, and pumped down to vacuum, and the gate valves are operated such that the specimen may be moved or otherwise transferred from the load lock chamber to the positioning stage within the IVC.

Control cables for the positioning stage, probing hardware, and system monitoring are coupled to one or more external controllers (illustrated as a single controller 348 in this example embodiment) via feedthroughs in the IVC, AHS, PHS, and OVC. The OVC and IVC feedthroughs are vacuum sealed, and cables (e.g., cables 330) are thermalized at the IVC, AHS, and OVC feedthroughs.

A convection loop comprises an evaporator cooled chuck 308 coupled to or disposed on the positioning stage 306 disposed within the IVC 302 and comprises a condenser 324 outside the IVC that is disposed on the second active cooling stage. Thus, the evaporator cooled chuck is disposed within the IVC, i.e., it is internal to the chamber defined by walls of the IVC, whereas the condenser is disposed outside the IVC, i.e., external to the chamber defined by walls of the IVC.

In embodiments, the evaporator cooled chuck is connected to the external condenser by stainless tubing, including flexible bellows lines inside the IVC to allow for relative motion of the positioning stage. There are two separated lines, one for condensed liquid, and one for evaporated vapor, although the system could be constructed with a single line in a heat pipe configuration, subject to alternate performance limitations, i.e. coupled pressure boundary conditions. These two lines are connected to the gravity high side (vapor) and gravity low side (liquid) of the condenser and evaporator to take advantage of (and ideally, to take maximum advantage of) the natural convection induced flowrate. When the system is initially cooled and connected to an external helium gas reservoir that is connected to the vapor side of the condenser, helium gas will condense inside the condenser and flow down to the evaporator. This helium liquid will initially be re-vaporized as the return liquid piping and evaporator are cooled. Once these components are sufficiently cool, the liquid will start to fill the reservoir within the evaporator. The accumulation of liquid in the evaporator can be confirmed by observing a sharp drop in evaporator temperature. Once this state has been achieved, high thermal conductance between the evaporator and condenser will be initiated and maintained by the evaporation and re-condensation of the helium working fluid.

Figure 4A:
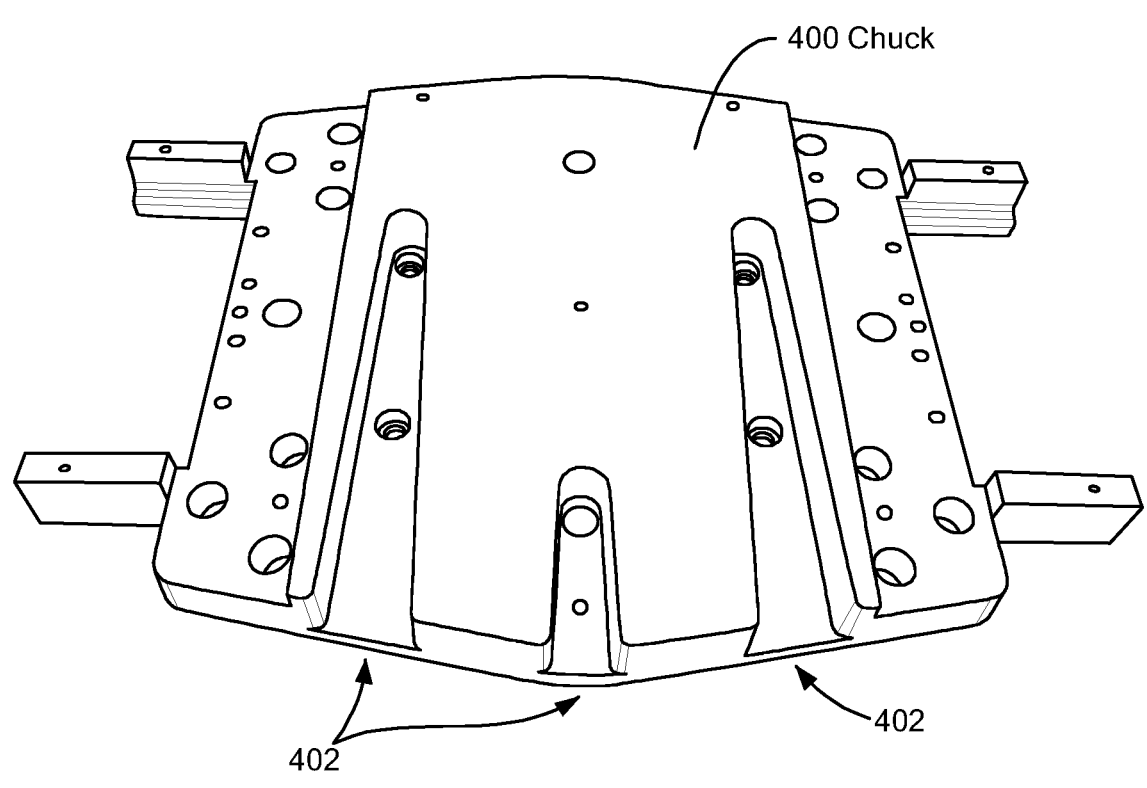
FIG. 4A is an isometric view of a chuck provided in accordance with the concepts described herein and which is suitable for use in at least the embodiments shown in FIGS. 2, 2A and 5A.
Figure 4B:
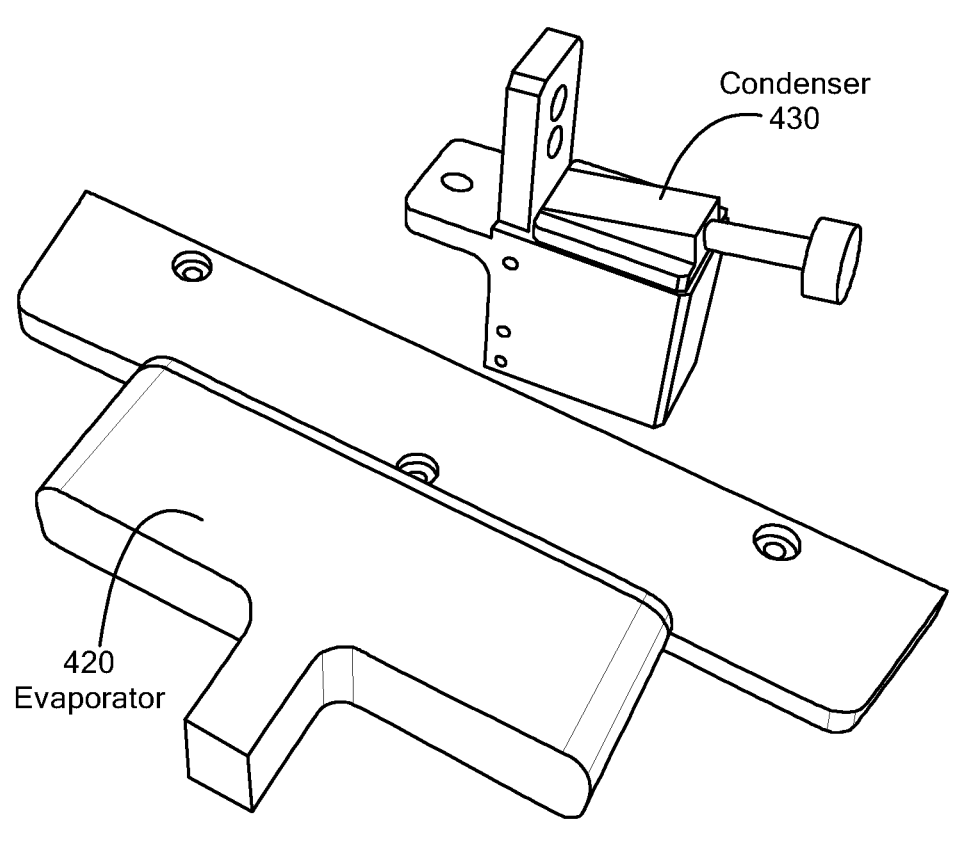
FIG. 4B is an isometric view of an evaporator and a condenser suitable for use in at least the embodiments of FIGS. 2, 2A and 5A.

Operation of an example cooling system operating as described above was confirmed through the use of integrated heaters, and temperature sensors, as illustrated in FIGS. 4A-4C.

Figure 1D:
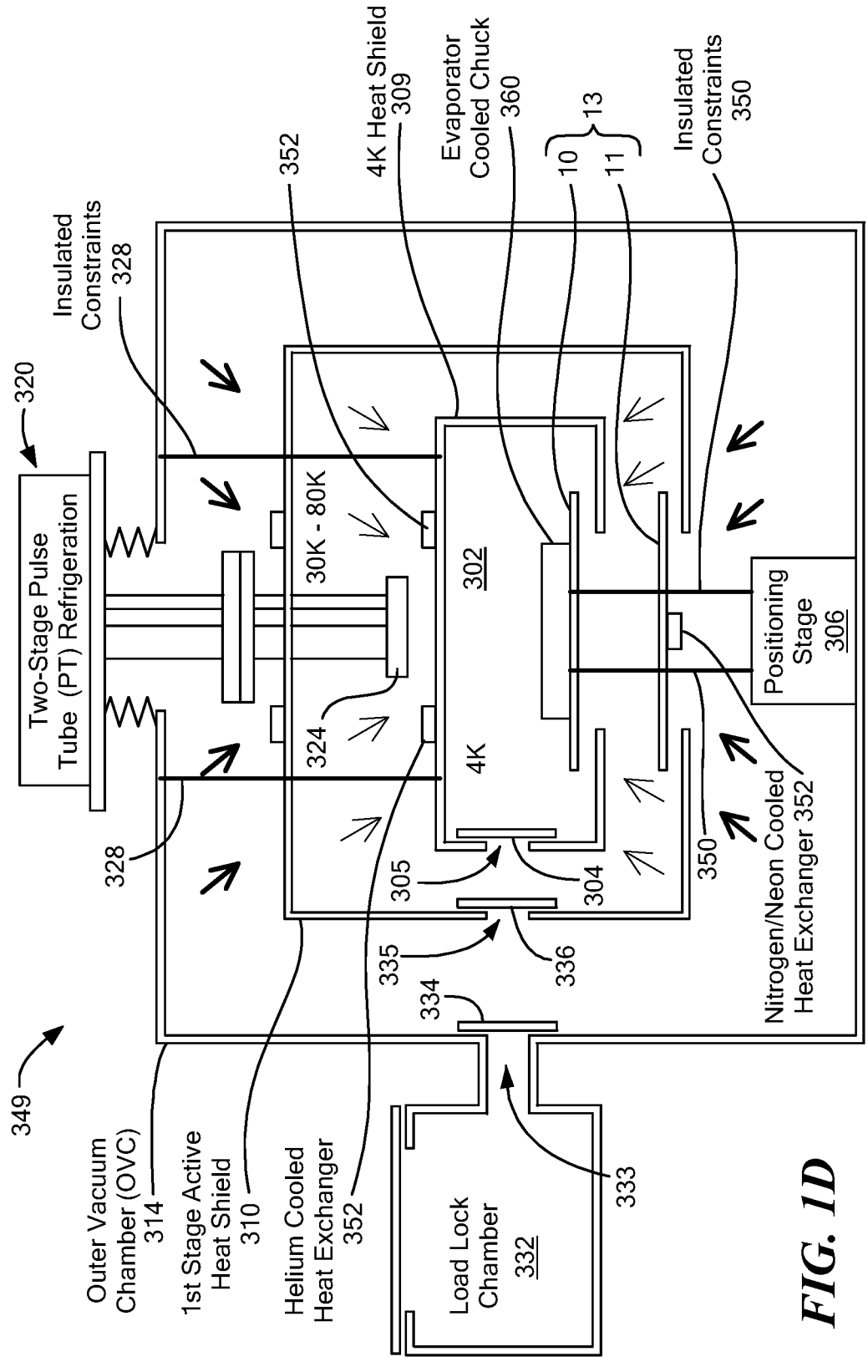
FIG. 1D is a block diagram of an alternate embodiment of a semi-automatic cryogenic wafer prober.

Referring now to FIG. 1D, shown is a semi-automatic cryogenic wafer prober 349. The system of FIG. 1D is an alternative to the system of FIG. 1C. System 349 comprises a single outer vacuum chamber (OVC) 314 with two actively cooled heat shields 309, 310 thermally connected to first and second stages 11, 10 of a two-stage cryocooler 13. The OVC maintains a vacuum within the entire system. The outer actively cooled heat shield (AHS-O) 310 is disposed within the OVC, is thermally connected to the $1^{st}$ cooling stage, as indicated in FIG. 1D. The inner actively cooled heat shield (AHS-I) 309 (marked as a 4 K shield 309) is disposed within AHS-O and is thermally connected to the $2^{nd}$ cooling stage 10. AHS-I replaces the functionality of the inner vacuum chamber (IVC) in the previously described example system of FIG. 1C. However, in this embodiment, the wafer positioning stage 306 is disposed within the OVC and thermally connected to it, rather than within AHS-I as in FIG. 1C.

A set of thermally insulating constraints 350 links the motion controlling platform of the positioning stage 306 to a wafer-holding, evaporator cooled chuck 360, and two attached moving heat shields, 10 and 11. These moving shields overlap the fixed heat shields (AHS-O and AHS-I) to maintain radiative heat shielding during wafer motion and probing. Openings 305, 333, 335 are provided in respective ones of the OVC, AHS-O, and AHS-I to accommodate wafer loading from an external load lock chamber, and these openings are closed via shields or doors 304, 334, 336 after wafer loading.

Helium convection cooling loops are used to cool the inner moving heat shield 10 and the evaporative cooled chuck 360. The outer 1st stage active heat shield 310 can be cooled with conventional thermal straps, or using nitrogen or neon convection cooling loops 352 for stage temperatures from 30° K to 80° K. The outer moving heat shield 11 could be similarly cooled, albeit with larger temperature drops for conventional thermal straps that would need to be longer to accommodate the shield motion. Alternatively, a conventional liquid nitrogen heat exchanger could also be used. Alternatively still, a bearing or thermal switch approach could also be used.

Insulating constraints 328 connect the fixed heat shields 309, 310 to the inner structure of the outer vacuum chamber. These thermally insulating constraints can be fabricated or otherwise provided from any structural materials with sufficiently low thermal conductivity for the region of application. In embodiments, stainless steel, titanium alloys, and fiberglass epoxy laminates, could all be used and have been used.

Re-closeable openings 305, 333, 335 for wafer loading are maintained in this embodiment. Accordingly, each of the OVC, AHS-O (50° K shield) and AHS-I (4° K shield) comprise passively or actively controlled doors or gate valves, e.g., an OVC gate valve 334, an AHS-O door 336, and an AHS-I door 304. The OVC gate valve can be a standard commercial component. The AHS doors can be passively controlled, e.g., spring-loaded, or actively controlled, e.g., using a motor or mechanical feedthrough. The gate valves and doors lead to a load lock chamber. In operation, a holder mounted wafer to be tested or any other compatible specimen is disposed in the load lock chamber and the gate valves and doors are operated such that the specimen may be moved or otherwise transferred from the load lock chamber to the positioning stage within the 4° K shield while in a vacuum.

Active cooling of the fixed and moving heat shield components is required in the embodiment shown in FIG. 1D. In embodiments, this active cooling may be achieved by creating a thermal link to the relevant cold stage. This thermal link can be achieved by use of direct mechanical mounting, conventional thermal straps, the use of convection loops, and/or cryogenic heat pipes using an appropriate working fluid for the temperature range of interest. The fixed shields, AHS-I and AHS-O can be thermally linked using any of the above methods. In this embodiment, the moving inner (4° K) shield is linked to the $2^{nd}$ cold stage of the cryocooler by a helium convection loop as previously described. The moving outer (30° K-80° K) shield can be linked to the 1st cold stage of the cryocooler by a convection loop using neon, nitrogen or other working fluid. This embodiment would be similar in design the helium convection loop mentioned above. In other embodiments, a single tube heat, cryogenic heat pipe could be used. These embodiments might require active heating of the condenser to prevent the working fluid from solidifying. The moving outer heat shield could use a liquid heat exchanger connected by a combination of stainless bellows flex lines and hard tubing to a conventional, external liquid nitrogen dewar. Alternative embodiments could use conventional heat straps, sliding thermal links, or thermal switches.

Referring again to FIG. 1D, operating temperatures are achieved using the cryocooler 320. The cryocooler cold stages are thermally connected to the fixed active heat shields. In some embodiments, additional active cooling from supplemental liquid nitrogen heat exchangers can be used to reduce the time required for cooling. Once the cryocooler achieves operating temperatures, the chuck and holder mounted wafer, if pre-loaded, are cooled to operating temperatures by the helium convection loop, as previously described. In this embodiment, the total thermal mass of the cooled active heat shields and probing system hardware is considerably reduced, about 80% or more for AHS-I. This thermal mass reduction is because the wafer positioning stage 306 is moved to the OVC and because the sealed IVC, gate valve, and exchange gas are removed from the system. In this embodiment, the heat load from all the electrical connections associated with the positioning stage is removed from AHS-I. In addition, removing the position stage from AHS-I will allow for a reduction in size, and as a result, radiative heat loads. Operation of the wafer probing system, including wafer loading and unloading from the cooled system, will proceed in a manner which is the same as or similar to the previously described example system. In all embodiments, sensors (e.g. optical sensors) may be used to correct for thermal contraction induced motion of the probing hardware.

Figure 2:
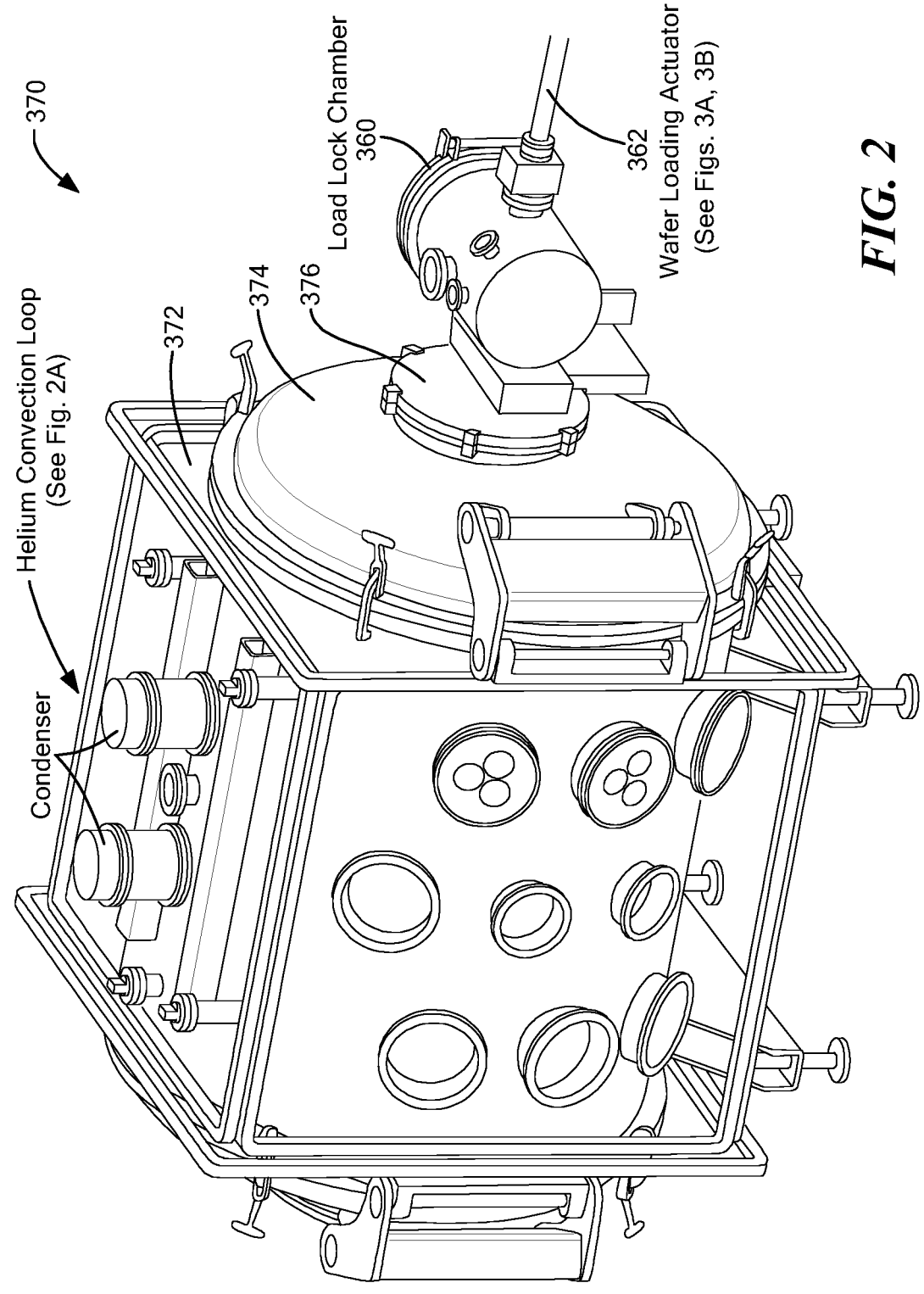
FIG. 2 is an isometric view of a cryogenic wafer probing system.

Referring now to FIG. 2, an illustrative embodiment of a cryogenic wafer probing system 370 includes an outer chamber 372 having a first vacuum door 374 which itself comprises a second vacuum tight opening 376 which serves as a means for allowing a wafer to be tested to be positioned within the cryogenic wafer probing system. Although not visible in FIG. 2, the cryogenic wafer probing system may also comprise one or more of an IVC, AHS, PHS, and OVC as described above in conjunction with FIGS. 1A-1D.

An external, separate wafer loading chamber (also sometimes referred to as a "load lock chamber") 360 is coupled to the second vacuum tight opening. The load lock chamber has an independent vacuum system. A wafer loading actuator 362 is coupled to load lock chamber 360.

In operation, a specimen, e.g., a wafer to be tested is mounted on a wafer holder assembly (to be described in detail below in conjunction with FIGS. 3B-4B). The wafer and wafer holder assembly are disposed in the load lock chamber. The chamber is closed, locked, and pumped down to vacuum. A series of gate valves (e.g., which may be the same or similar to the gates valves describe above in conjunction with FIGS. 1C, 1D) are operated such that the specimen may be moved or otherwise transferred from the load lock chamber to a positioning stage within an inner vacuum chamber (IVC) of the cryogenic wafer probing system. An example positioning stage is described below in conjunction with FIGS. 5A-6D. Control cables (not visible in FIG. 2) for the positioning stage, probing hardware, and system monitoring are coupled to one or more external controllers (not shown in FIG. 2) via feedthroughs in the IVC, AHS, PHS, and OVC. The OVC and IVC feedthroughs are vacuum sealed, and the cables are thermalized at the IVC, AHS, and OVC feedthroughs.

The cryogenic wafer probing system further comprises a helium convection loop (e.g. a two-phase helium convection loop). As will described below in conjunction with FIG. 2A, the helium convection loop comprises a remote helium evaporator mounted at a cooled load; flexible bellows tubing, e.g., flexible stainless steel bellows tubing, to allow relative motion between the condenser and a cooled evaporator on the load. In at least some embodiments, the helium convection loop utilizes flexible welded bellows and a cold head. The helium convection loop described herein is an improvement over solid thermal straps for applications operating near liquid helium temperatures and results in one or more of: improved effective thermal conductance for a given stiffness and weight; temperature monitoring and control via system pressure; and enhanced isolation from mechanical vibration associated with the commercial coolers. Furthermore, with the helium convection loop architecture described herein, performance is relatively insensitive to actual distance between the cooler and cooled load.

In embodiments the helium convection loop system may include: a single heat pipe (versus a two-pipe convection loop); and/or expansion reservoirs. In embodiments, helium pressures can be extended to the supercritical regime to extend performance to temperatures above normal liquid helium. In other embodiments alternate pure liquids may be used for a wider temperature range.

Thus, the example system of FIG. 1D the system may include a number of features, including, but not limited to: a CTE matched, single crystal silicon wafer holder; a 4° K cryogenic load valve; a cryogenic magnetometer and readout electronics; a stage actuated, high-force clamping wafer chuck design; and chuck-integrated, helium convection loop components as described above.

Accordingly, the example system of FIG. 1D provides all functionality for heatsinking superconducting and low-temperature circuitry at the wafer level, and for semi-automatically inserting, testing, and removing holder mounted wafers in accordance with the concepts described herein. As describe above, the system includes a main vacuum chamber with coupled load lock chamber, wafer loading actuator, wafer loading gate valves, cryogenic cooling system with two pulse-tube refrigerators, and control and measurement signal feedthroughs. These subsystems are described in detail below.

Figure 2A:
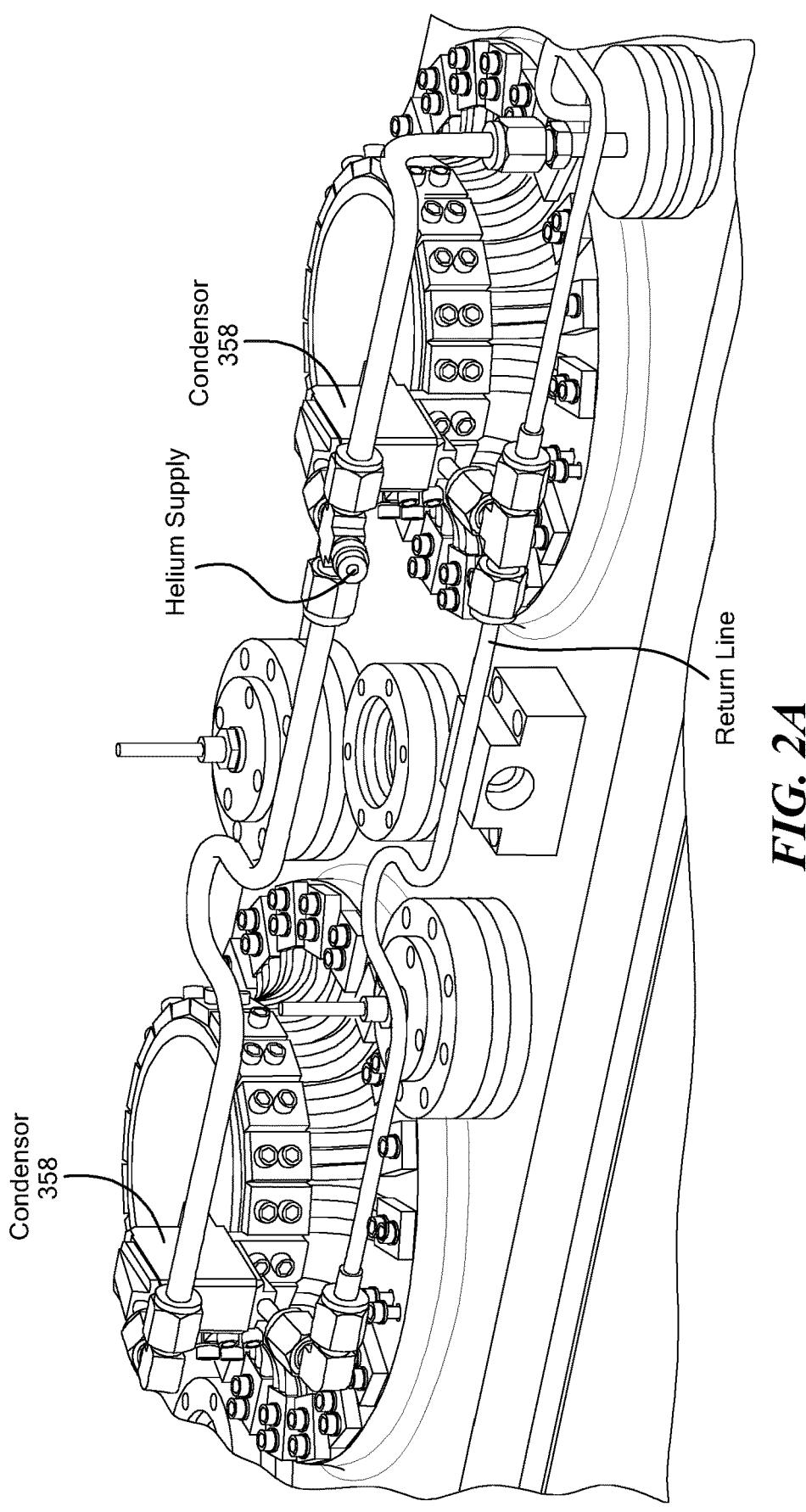
FIG. 2A is an isomeric view of the piping external to the internal vacuum chamber (IVC) on an example cryogenic wafer probing system system having a pair of condensers and a helium supply feed.

Referring now to FIG. 2A, an example helium convection loop comprises one or more He condensers 358 disposed on external actively cooled surfaces, e.g., on the $2^{nd}$ stage of two-stage pulse-tube coolers. In the example system, the actively cooled surfaces are also connected through conventional thermal straps to a wall which defines at least a portion of an inner vacuum chamber or a 4° K shield. In the example of FIG. 2A, the helium convection loop comprises a pair of coupled He condensers disposed on a two-stage pulse-tube cooled system which is also thermally strapped to the wall of the IVC. A convection loop feedthrough is coupled through a wall of the IVC, connecting the condensed liquid delivery (smaller diameter, lower tubing in FIG. 2A) and vapor return (larger diameter, upper tubing in FIG. 2A) to the evaporative cooled chuck and wafer inside the chamber.

A helium supply is coupled to the vapor return line and gravity top return ports of both condensers via an externally coupled supply line. The external coupling passes to a helium pressure bottle which is charged with the required mass of helium. When the system is warm, the helium gas is fully contained within the piping and external bottle at an elevated but safe pressure for the reservoir bottle in use. As the system cools down, helium pressure reduces, and the system operating state is determined by the operating temperature of the evaporator cooled chuck once liquid condenses in the evaporator. In embodiments, the helium could pass through an intermediate heat exchanger and accumulator coupled to the first cooling stage of the cryocooler system. In embodiments, external piping components could include valves and gauges to monitor, charge, discharge, and clean the system.

Piping internal to the IVC will be illustrated and described in conjunction with FIG. 5A below.

Figure 3A:
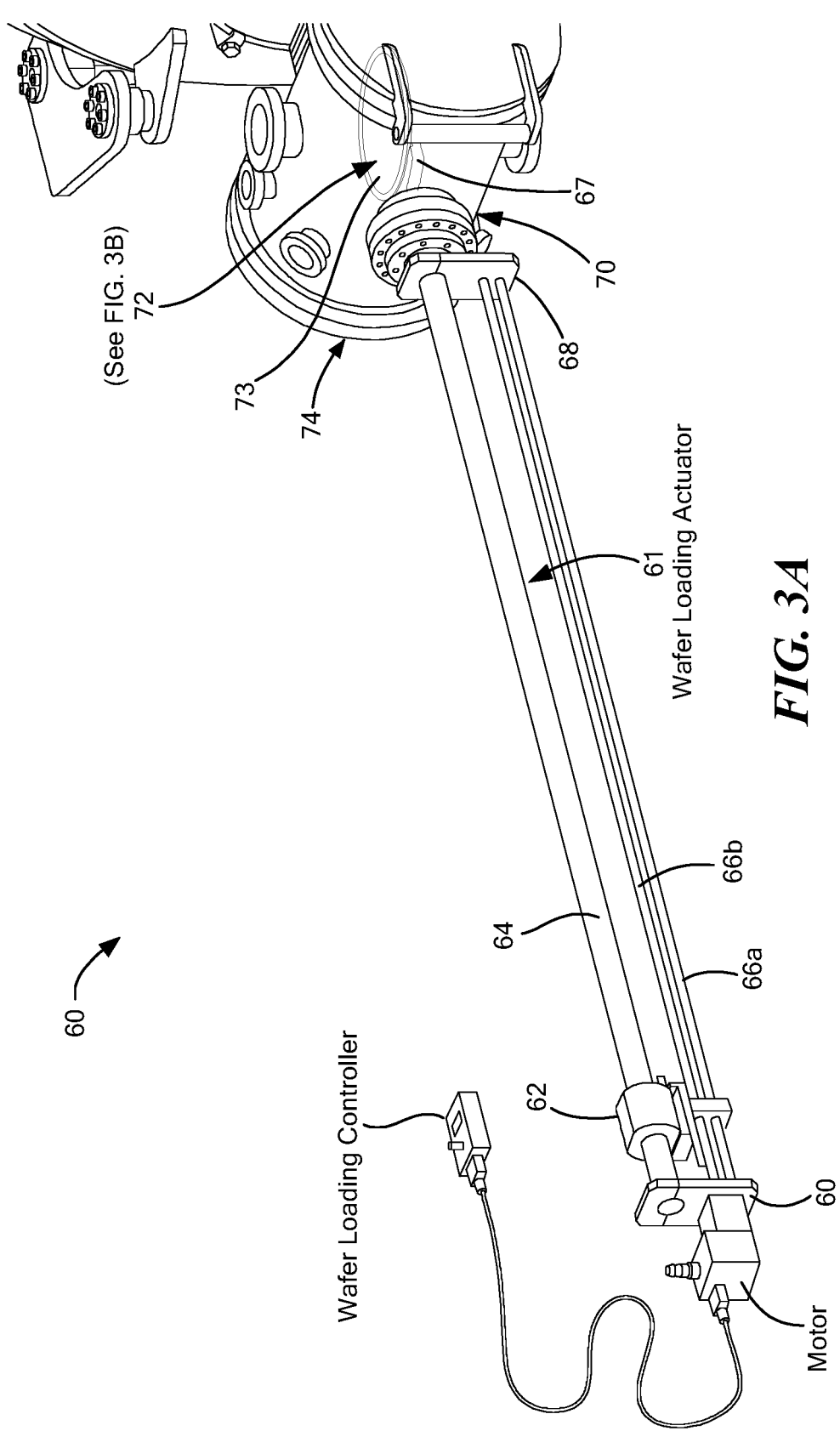
FIG. 3A is an isometric view of a mechanism for transferring a wafer mounted on a wafer holder into a cryogenic probing system.
Figure 3B:
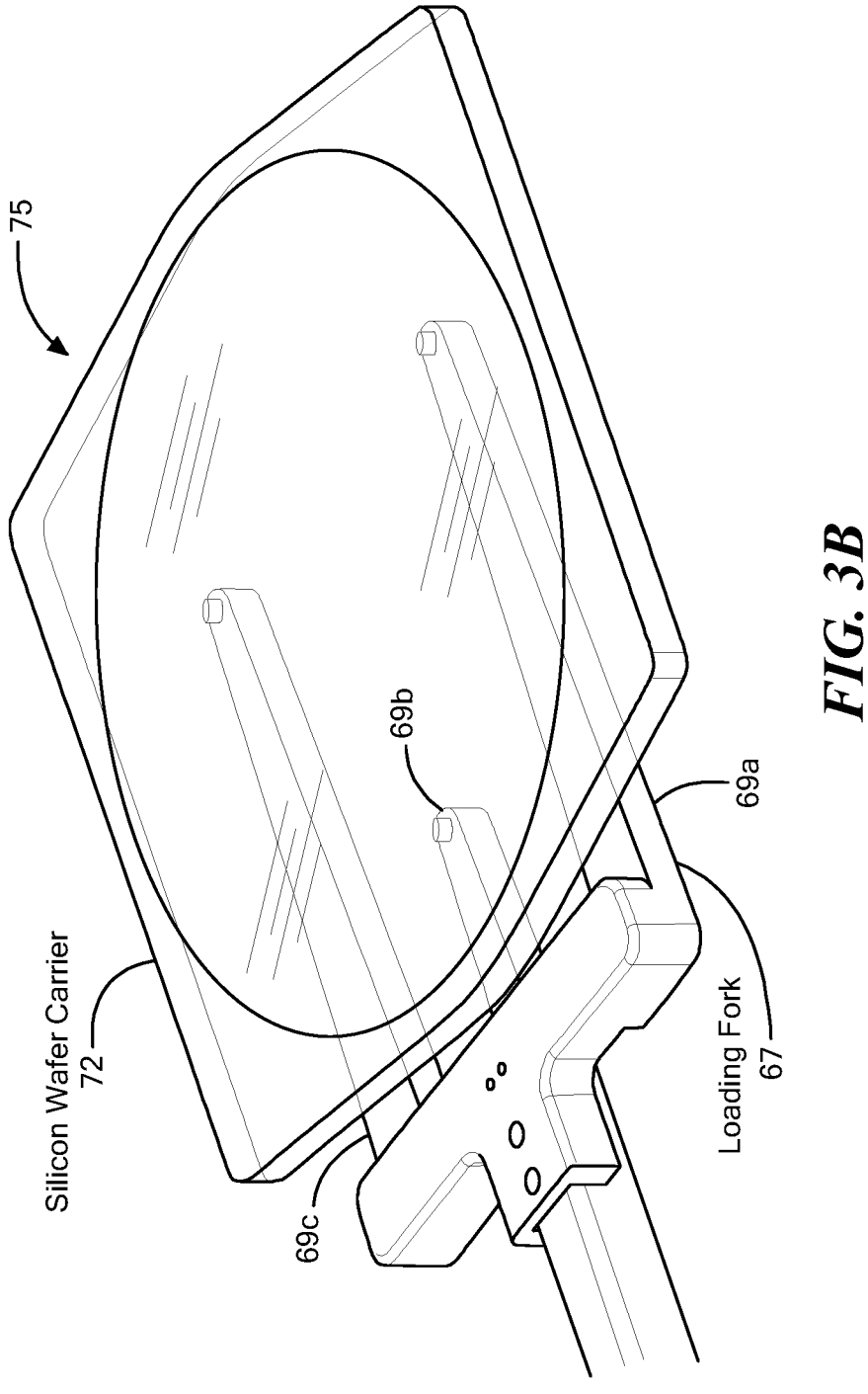
FIG. 3B is an isometric view of a wafer insertion tool suitable for use with the wafer transfer mechanism of FIG. 3A.

Referring now to FIGS. 3A and 3B in which like elements are provided having like reference designations, a wafer loading system 60 comprises a wafer loading actuator 61, a wafer insertion structure 67 having disposed thereon a wafer carrier, 72 (also sometimes referred to herein as a wafer "holder"), and a feedthrough flange interface 70 which leads to the inside of a load lock chamber (74). A wafer to be tested 75 (e.g., a silicon wafer) may be mounted on a surface of the wafer carrier 72. As will become clear from the description herein, wafer carrier 72 is a first portion of a wafer holding structure within a cryogenic chamber. In embodiments, wafer carrier (or holder) 72 is configured to fix (i.e. removably secure, or rigidly attach) the wafer to be tested 75 in a known or one-time measurable coordinate frame.

In embodiments, the wafer loading actuator 61 may comprise a conventional, magnetically coupled vacuum linear actuator with an external motorized lead screw actuator and is available as a commercial system. Alternative actuator designs, including rigid chain approaches, could clearly be used, as well, to reduce space or simplify operation. In embodiments, additional external structure may be needed to support the linear actuator and align the load axis to the load lock chamber. In other embodiments, repeatable alignment fixtures and optical sensors could be used to measure and adjust loading axis alignment.

In this example embodiment, the wafer to be tested 75 is mounted on wafer carrier 72 which in turn is disposed on insertion structure 67. Although in this example, insertion structure 67 is illustrated as having a fork-shape with three (3) prongs 69a, 69b, 69c. Thus, insertion structure 67 may sometimes be referred to herein as a "loading fork structure." Other shapes may, of course, also be used.

The carrier 72 (here illustrated as a silicon wafer carrier 72) and mounted wafer 75 is coupled or otherwise disposed on the loading fork structure 67 using integrated alignment features. Thus, a wafer loading system provides a mechanism for moving or transferring a holder mounted wafer from a load lock chamber e.g. as shown in FIGS. 1C, 1D, to a wafer chuck such as one integrated on a position stage as will be described in conjunction with FIG. 5A.

A controller allows the wafer loading system to move wafer carriers (with wafers disposed thereon) into and out of the prober system.

Figure 3C:
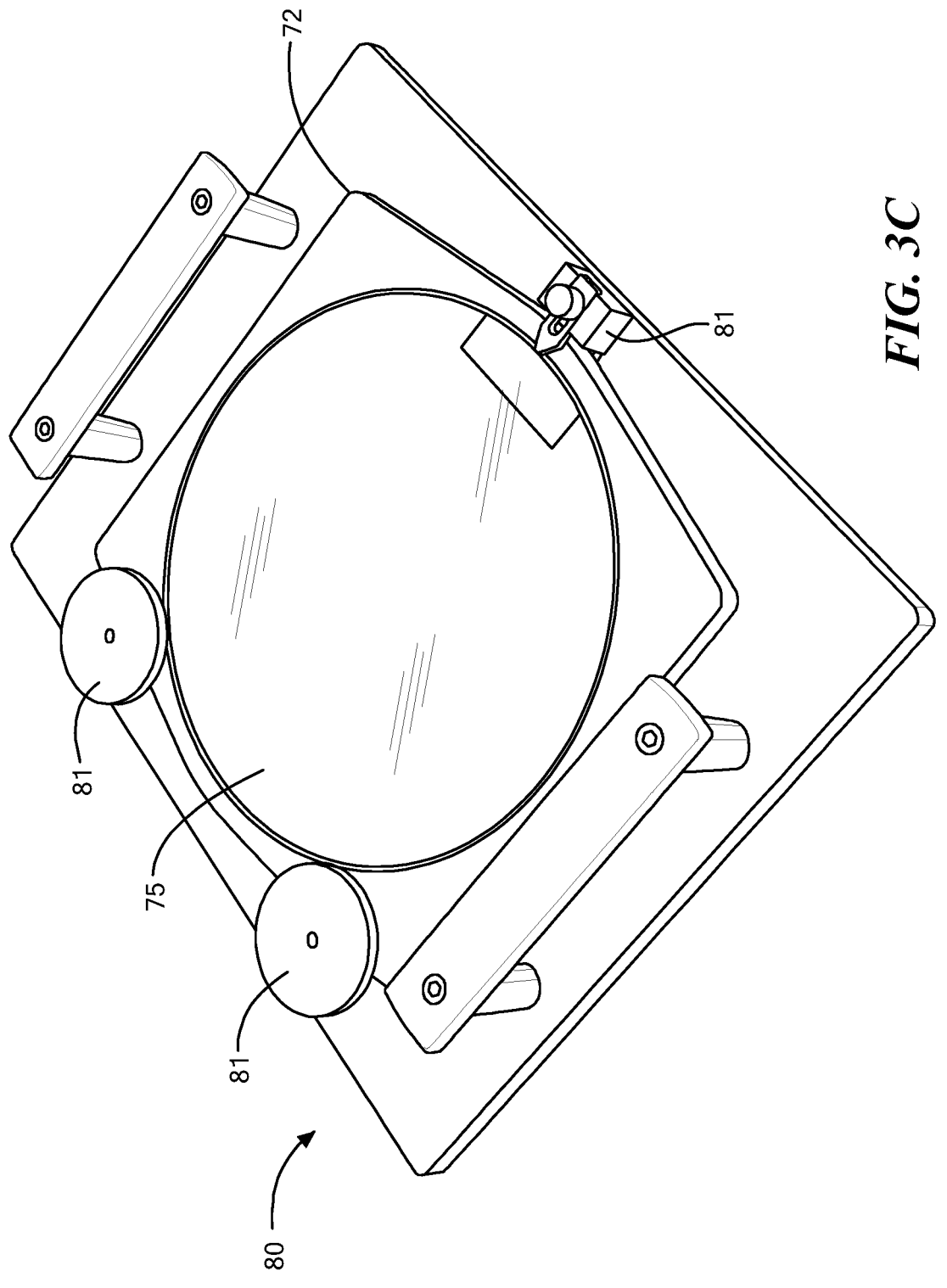
FIG. 3C is an isometric view of a wafer and wafer carrier coupled to a wafer alignment tool.

Referring now FIG. 3C, a semiconductor or dielectric wafer (or more simply a "wafer") which may be the same as or similar to the wafer described above in conjunction with FIGS. 3A and 3B is coupled to a wafer alignment tool 80 which is used to align the wafer for mounting on a wafer carrier (or wafer holder) which may be the same as or similar to any of the wafer carriers described above (e.g., wafer holder 72 described in FIGS. 3A, 3B). The wafer alignment tool provides geometric location to a wafer which is mounted on a wafer carrier and comprises one or more locating or alignment members 81.

As noted above the wafer carrier is in thermal contact with a wafer disposed thereon and provides a thermally conductive substrate with sufficient strength to withstand required contact forces for thermal heat sinking in a vacuum environment. The aligned, carrier (or holder) mounted wafer is designed for insertion into a wafer prober or other test system which may be the same as or similar to one of the systems described above in conjunction with FIGS. 1A-3B. The wafer alignment tool 80 may be significant as a component in an overall wafer probing system (such as that in FIG. 2) since it enables a wafer to be tested (e.g., wafer 75) to be mounted on a wafer holder (e.g., holder 72) with a required precision for a particular application.

As noted above, the wafer holder may be provided as a single crystal silicon wafer holder or may be provided from other material having a coefficient of thermal expansion (CTE) which substantially matches a CTE of a wafer to be disposed thereon. The material from which the wafer holder is provided ideally has thermal conductivity characteristic which promotes thermal transfer between the wafer and the holder. For example, if a wafer under test comprises sapphire (e.g., a wafer having a sapphire substrate) a wafer holder may be provided from or comprise sapphire (i.e., the wafer holder maybe provided from the same or a similar material as the wafer to be tested).

As noted above, in embodiments, the wafer holder may be constructed from a material having a coeffcient of thermal expansion (CTE) which matches or substantially matches a CTE of a wafer to be tested (e.g., which matches the CTE of a substrate material of the wafer to be tested). In embodiments, the wafer holder may be constructed from or otherwise comprise a material single crystal silicon to match (or substantially match) the coeffcient of thermal expansion (CTE) of a wafer substrate material. In other embodiments, the wafer holder may be constructed from or otherwise comprise a single crystal germanium or other matched CTE materials. In embodiments, a wafer may be removably secured to (e.g., temporarily attached to) the wafer holder using cryogenic rated vacuum grease which will provide sufficient mechanical and thermal contact. In other embodiments, the wafer may be removably secured to (e.g., temporarily attached to) with adhesives or fluids.

Figure 5A:
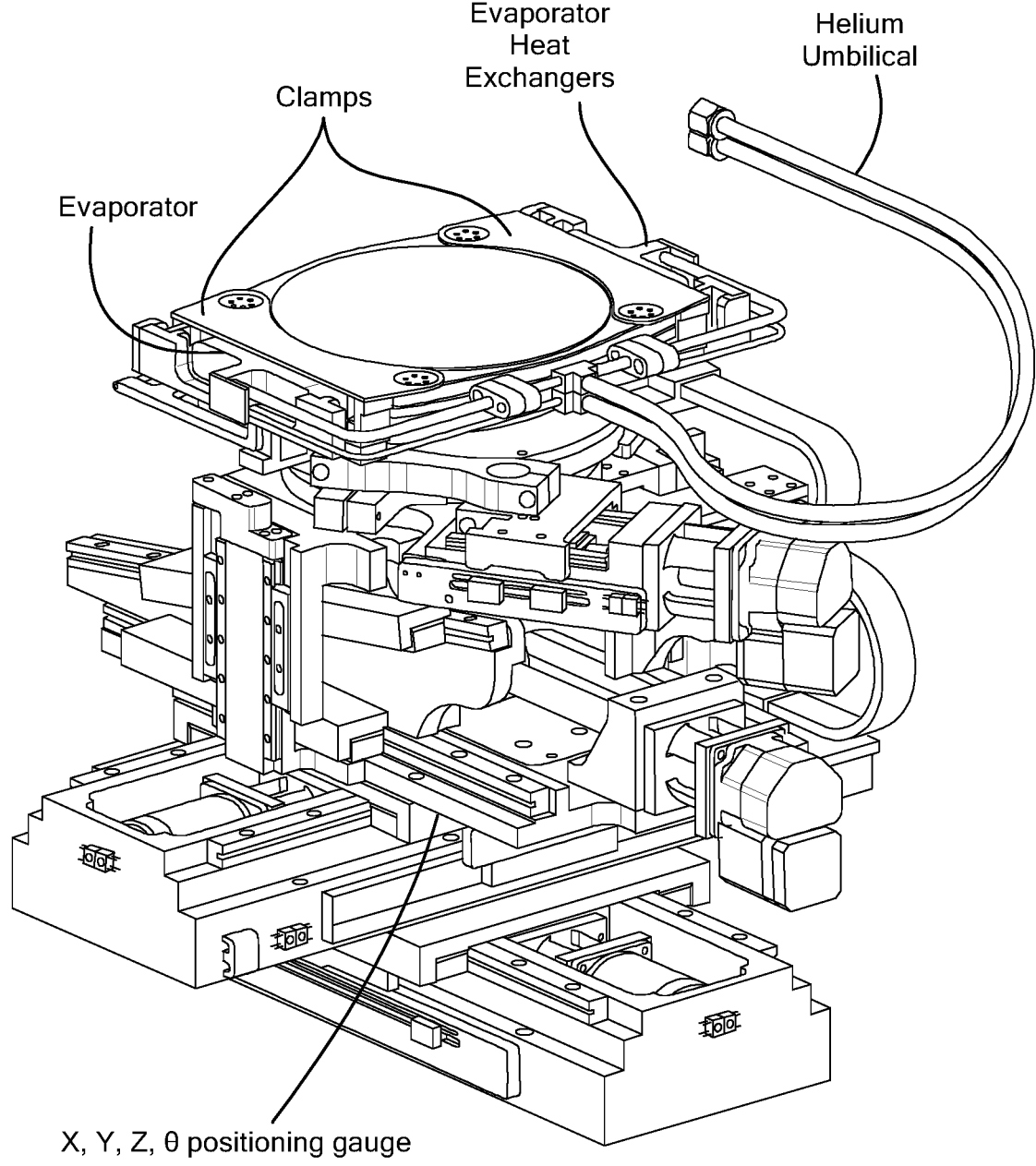
FIG. 5A is an isomeric view of an example wafer positioning stage having a helium cooled wafer chuck and FIG. 5A also illustrates piping internal to the IVC on the wafer positioning example stage.
Figure 5B:
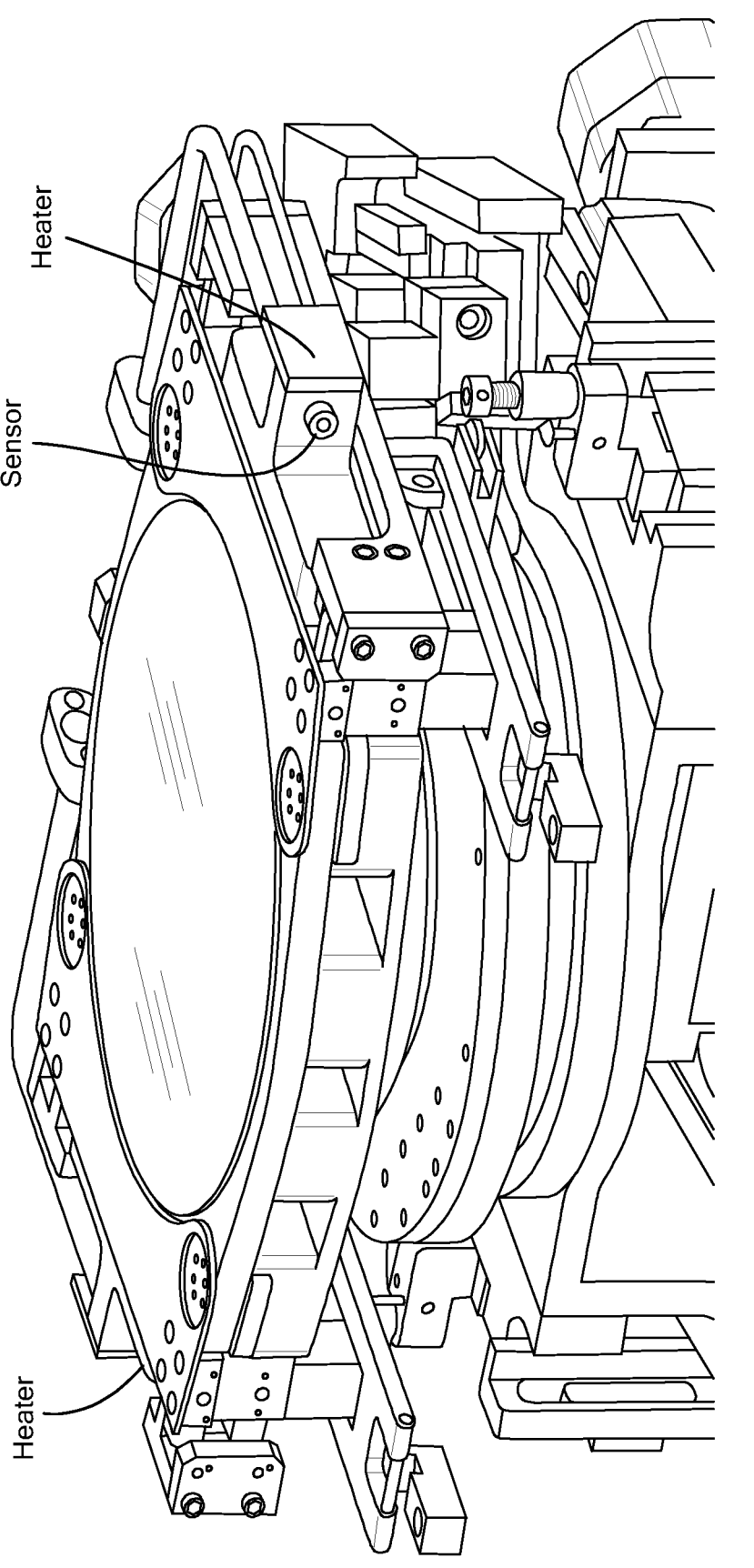
FIG. 5B is an isomeric view of a portion of the example stage of FIG. 5A illustrating heaters and sensors used for thermal performance measurements.
Figure 5C:
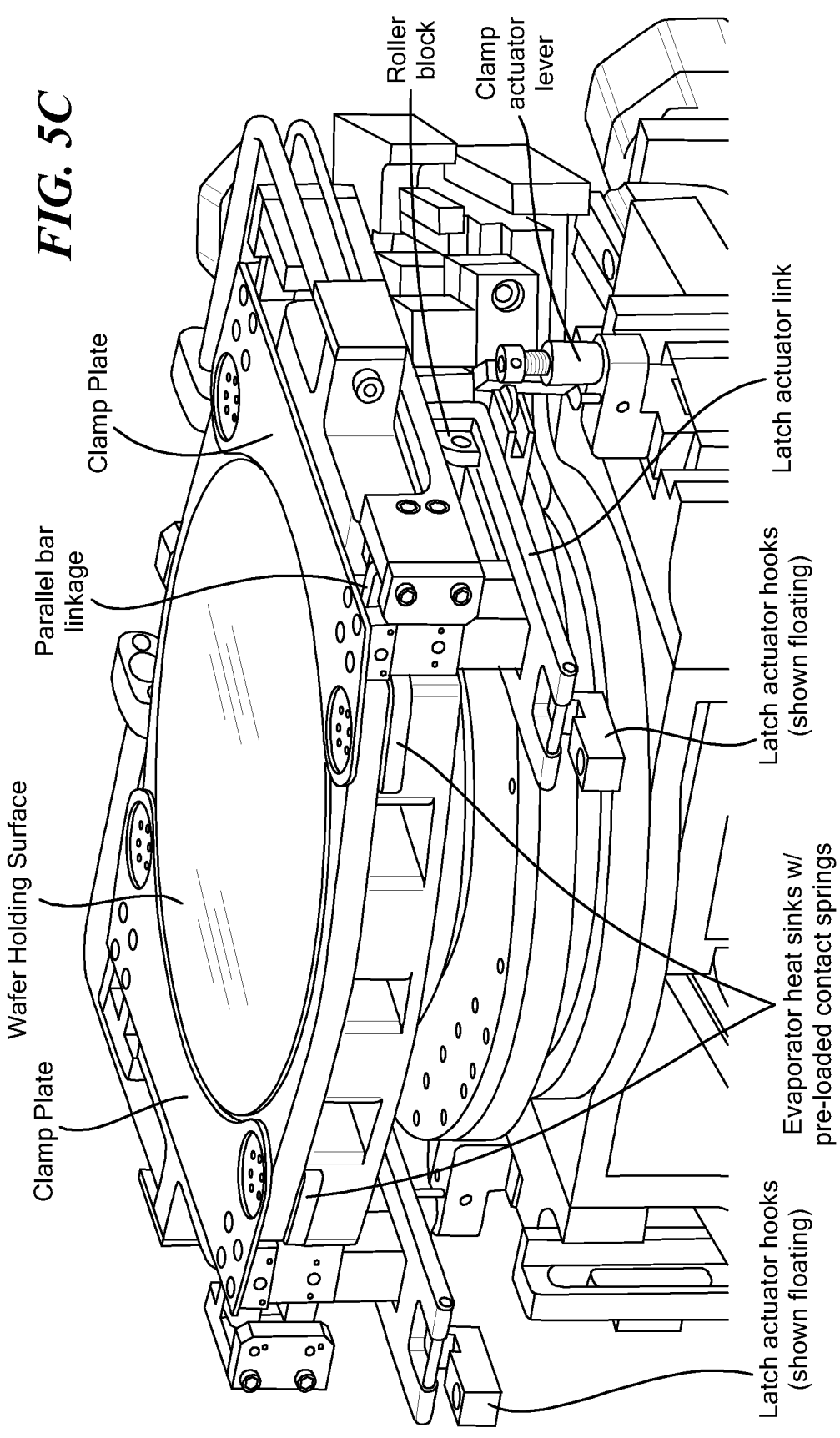
FIG. 5C is an isomeric view of a portion of the example stage of FIG. 5A illustrating installed wafer holder and wafer, clamp plates and latch mechanics.

As will be explained in detail below, it should be noted that the wafer carrier corresponds to a first portion of a wafer holding structure (an example of which is illustrated in FIGS. 5A-5C). The wafer carrier is configured to locate (i.e. geometrically align) a wafer under test to a particular position within a test chamber of a test system such as automatic probing system. For example, the wafer carrier may be configured to locate (i.e. geometrically align) a wafer under test to a particular position on a motion stage (such as the motion stage described below in conjunction with FIGS. 5A-5C). The wafer carrier also acts as a heat sink for a wafer under test.

In embodiments, the wafer carrier comprises a core configured to be in mechanical and thermal contact with a wafer to be tested without transverse deformation during wafer probing and testing (as would happen if the wafer to be tested were probed without this structure). In embodiments, the core may be provided from a material selected to enhance in-plane thermal conductance for wafers in thermal contact with a surface of the wafer holder. Further, the material from which the core is provided is provided having a thickness selected to enhance in-plane thermal conductance for wafers in thermal contact with a surface of the wafer holder. In embodiments, the core is provided having a width to thickness ratio <10 in at least one dimension. In embodiments, the material from which the wafer carrier is provided comprises a thermally conductive material. In embodiments, the material from which the wafer carrier comprises a metal. In embodiments, the wafer carrier comprises a metal core. In embodiments, the metal core comprises copper and/or aluminum. In embodiments, a wafer carrier provided in accordance with the concepts described herein may comprise a metal core substantially consisting of copper and/or aluminum. In embodiments, the wafer carrier may comprise a single crystal silicon wafer holding structure. The wafer carrier may, of course, also be provided from other manufacturable materials, providing the materials have adequate thermal and mechanical properties (i.e., the materials have thermal and mechanical characteristics sufficient to allow the wafer carrier to function as intended—i.e. to perform wafer holding and heat sinking functions while allowing for automatic insertion, alignment, and removal of the wafer during testing). In embodiments, the wafer carrier may comprise alignment and clamping features.

Such a wafer carrier may be fabricated using any techniques known to those of ordinary skill in the art.

As noted above, in accordance with the concepts disclosed herein, it has been recognized that in vacuum applications (e.g., cryogenic wafer probing systems) edge forces larger than those in conventional systems are required to secure a wafer in position for testing and adequate heat sinking of circuitry located on the wafer interior may not be possible to achieve using conventional approaches due to limited in-plane thermal conductance associated with thin wafer structures.

As also noted above, if a force required to hold and heat sink the wafer is so large that it is not possible to provide by front side contact from the wafer edge without fracturing the wafer or is limited by the environment and in-plane thermal conductance, then it is not possible to hold and heat sink the wafer by application of such force. Also, if a required wafer-holding and heat sinking force is in an intermediate region (i.e. between a force less than the maximum allowable bending stresses in the wafer and a force which is so large that it is not possible to hold the wafer without fracturing the wafer) then the force may require a significant deformation in the wafer either forcing a curved surface or pre-deformation of the wafer. Such wafer deformation causes difficulties in and generally makes more complicated the wafer growing process.

It should be appreciated that a wafer holding structure for use in cryogenic and vacuum environments comprises two parts: (1) a first portion (also sometime referred to hereon as a "first part," a "fixed part" a "wafer holder assembly," a "wafer holder or a "wafer carrier") configured to be removably secured (or "fixed") to a wafer to be tested; and (2) a second portion (also sometimes referred to herein as a "second part" or a "chuck" to be described further below in conjunction with at least FIG. 3C) that remains with the probing system (e.g. is configured to remain in a testing chamber portion such as an IVC of a probing system). An example wafer holding structure (i.e., the combination of the wafer carrier and chuck) is illustrated in conjunction with FIGS. 5A-5C below. By proving a wafer holding structure in two pieces—i.e. a first portion (i.e. a wafer carrier) which moves into and out of a test chamber with a wafer and a second portion (i.e., a chuck) which always resides within a test chamber, it is possible to thermalize the wafer to be tested to the wafer carrier and then to thermalize the wafer-carrier assembly to the chuck. This approach reduces (and ideally minimize) temperature differences (and thus undesirable forces) on the wafter to be tested (e.g., a two-piece wafer holding structure approach enables cooling both a wafer under test and wafer-testing probes to the same (or substantially the same) temperature while maintaining a flat wafer geometry in a low-pressure or vacuum environment to interface with a wafer testing-probe. Thus, by providing a wafer holding structure comprising two separable portions—i.e. a first portion (also sometimes referred herein to as a "wafer holding portion," a "wafer carrier" or a "wafer holder") and a second portion (also sometime referred to herein as a "chuck portion"), it is possible to thermalize the wafer to be tested and the wafer carrier without regards to the temperature of the chuck portion of the wafer holding structure. The wafer and carrier assembly can then be thermalized with the chuck.

Referring now to FIGS. 4A and 4B, shown are an example chuck 400 (FIG. 4A), an evaporator 420 (FIG. 4B) and a condenser 430 (FIG. 4B) provided in accordance with the concepts described herein. The chuck, evaporator and condenser may be fabricated using conventional materials and methods but have been designed and sized for operation with a helium convection loop as described herein.

The chuck portion (FIG. 4A) provides force application and alignment functionality. In embodiments, the force application and alignment functionality provided by the chuck portion of the wafer holding structure is useful and may be required for automatic wafer probing applications.

In embodiments, the chuck portion of the wafer holding structure may comprise copper, aluminum, or other metals. In embodiments, the chuck portion may be thermally coupled to a probing structure by thermal straps to provide additional heat-sinking in a vacuum environment. In embodiments, multiple metals and other materials may be used to fabricate, assemble or otherwise construct at least the chuck portion of the wafer holding structure to provide both high thermal conductivity and adequate structural rigidity and alignment where needed. The chuck includes is provided having features (e.g. openings, or shaped structures) selected to mate or otherwise engage with a loading structure (e.g. such as loading fork 67 in FIG. 3B). Thus, in this example, a surface of the chuck is provided having a shape which is complementary to the shape of prongs 69a-69c of loading fork 67. (FIG. 3B).

As noted above, chucks used for automatic wafer probing perform wafer holding functions while allowing for automatic insertion, alignment, and removal of a wafer during testing. For wafer probing at temperatures other than room temperature, the wafer to be tested must come to thermal equilibrium with the chuck after insertion of the wafer and the chuck in a test chamber.

Application of the wafer clamping force prior to the wafer coming to thermal equilibrium may induce thermal stresses that could damage the thin wafer or affect the measurements taken during circuit testing once the wafer does come to thermal equilibrium. The amount of stress is related to the total change in wafer temperature and the difference between the coefficients of thermal expansion (CTEs) of the wafer and the chuck.

Consequently, for semiconductor crystal wafers and ordinary (or conventional) metal chucks, as typically constructed, the potential for large stresses exists when probing at cryogenic temperatures less than 100° K.

Thus, by providing a wafer holding structure comprising two separable portions—i.e. a first portion (i.e., the "wafer holding portion" or "wafer carrier" which moves outside the cryogenic chamber) and a second portion (i.e., the "chuck portion" which resides inside a cryogenic chamber), it is possible to thermalize the wafer to be tested and the wafer carrier without regards to the temperature of the chuck portion of the wafer holding structure.

Furthermore, as also noted above, by appropriate selection of materials, the chuck portion of the wafer holding structure used for automatic wafer probing within a vacuum environment also provides adequate in-plane thermal conductance to heat-sink probed circuits on the wafer under test.

Referring now to FIGS. 5A-5C in which like elements are provided having like reference designations throughout the several views, shown is an example wafer stage, also sometime referred to herein as a "wafer positioning stage" or more simply a "positioning stage," configured to be disposed in an inner vacuum chamber such as that illustrated in the system of FIG. 1C and operated near liquid helium temperatures (<10° K). The positioning stage is configured to move in X, Y, Z, and θ directions, i.e., it is an X, Y, Z, θ positioning stage. Disposed on the positioning stage is a wafer mounted wafer holding structure comprising a wafer carrier (or wafer holder) and clamped in a wafer chuck, as previously described. Here, the wafer chuck is provided as a pair of clamps. However, any means for holding or otherwise securing a carrier mounted wafer within the chuck assembly may also be used provided that it delivers adequate and controlled heat sinking and contact force.

Also disposed on the positioning stage and wafer chuck are one or more evaporator heat exchangers. A pair of fluid lines (which together are sometimes referred to as a "helium umbilical" as shown in FIG. 5A) have a first end coupled to the one or more evaporator heat exchangers (FIG. 5A) and a second, opposite end coupled to condensers, such as the condensers shown in FIG. 2A. These lines carry condensed helium liquid and return vapor between the condensers (FIG. 2A) and to/from the evaporator heat exchangers. Thus, the evaporator and condenser (FIGS. 4A, 4B) are integrated into the chuck. Such an integrated chuck design meets the cooling, heat sinking, and wafer location requirements needed to achieve <5° K prober operation.

FIG. 5B shows the wafer chuck assembly of FIG. 5A installed on the same positioning stage, but with added sensors and heaters used for performance testing the helium convection loop and evaporative cooling system.

Referring to FIG. 5C, a carrier mounted wafer (which may be the same as or similar to the wafer carrier of FIGS. 3A-3C) is coupled to the positioning stage via carrier clamp plates, latch mechanics, and a pair of spring-loaded evaporator heatsinks.

Figure 6A:
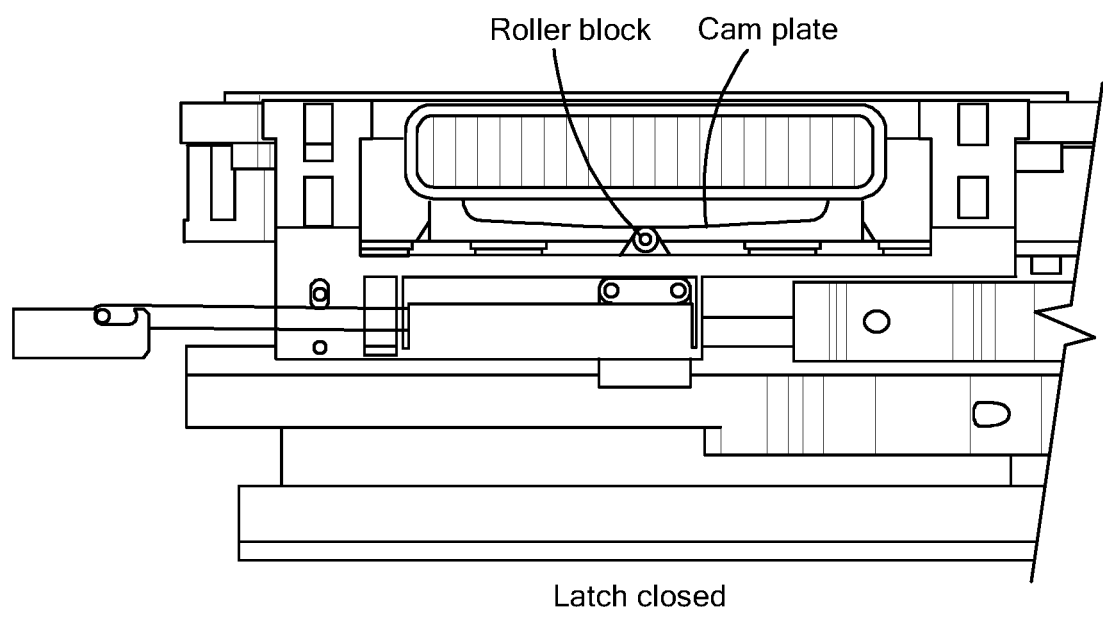
FIGS. 6A-6D are a series of views illustrating various combinations of latch and clamp positions and illustrating the steps required to insert a mounted wafer and holder into a system such as the cryogenic wafer probing system of FIG. 2.
Figure 6B:
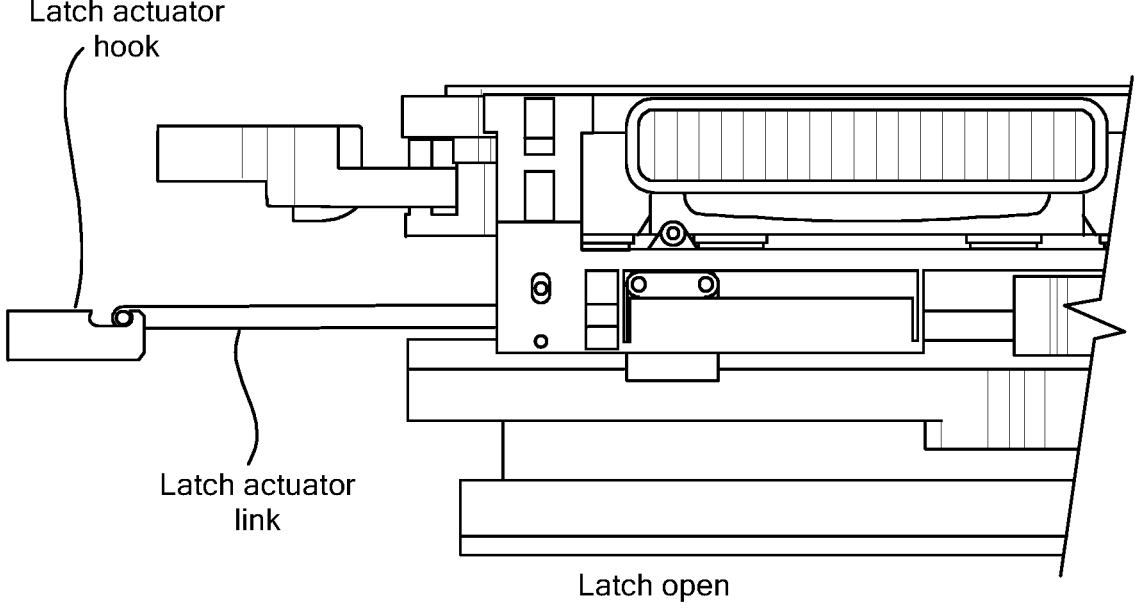

Referring now to FIGS. 6A-6D, illustrated are carrier clamp plates, latch mechanics, and a pair of spring-loaded evaporator heatsinks of the positioning stage of FIGS. 5A-5C. In the example system, the motion of the wafer stage is used to provide actuation to open, close, latch, and unlatch the clamps that hold the wafer carrier in position. These stage motions are preferably coordinated with a wafer loading system (which, for example, may be the same as or similar to the wafer loading system described above in conjunction with FIGS. 2 and 3A-3C) through an external controller (such as the controller illustrated in FIG. 3A) to allow wafer carriers to be inserted into and removed from the prober system. The major positions of the clamps and latch mechanisms are illustrated in FIGS. 6A, 6B.

Referring now to FIG. 6A, illustrated is the latch closed position where a rolling cam-follower block has been pushed along a cam plate to its lowest position in the center. This horizontal motion is created by engaging the latch actuator hooks in fixed anchors and commanding the stage to move. The cam actuation deflects a beryllium copper spring flexure which applies sufficient load (~100 lbf) to compress the heatsink springs and latch the latches.

FIG. 6B shows the rolling cam-follower block pulled back to the edge position, clear of the cam, and with the spring flexure effectively unloaded. In this configuration, there is still some clamp pressure from torsion springs built into the clamp mechanism, but nothing that would create the contact force needed to compress the heatsink springs and get good thermal conductance in the vacuum environment.

Figure 6C:
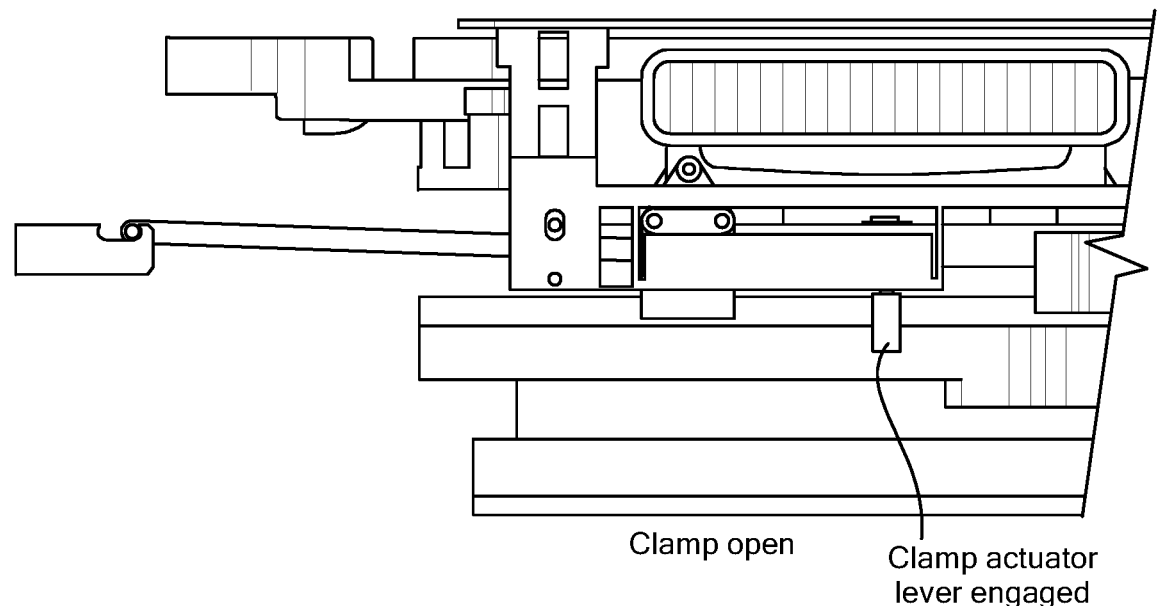
Figure 6D:
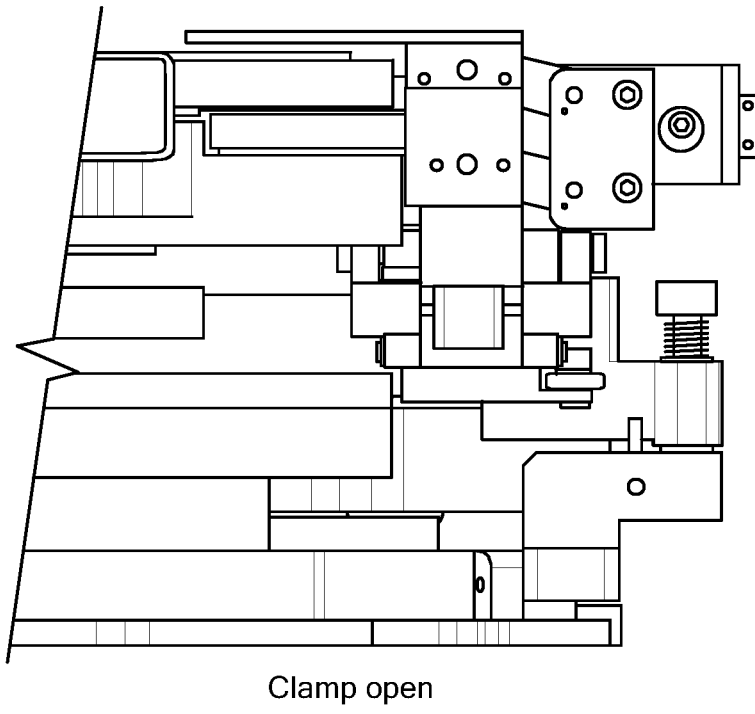

FIGS. 6C and 6D show the clamp plates in their open position, which occurs when the wafer stage moves downward and engages with an actuator lever that can push upward on the bar flexure. The spring-loaded evaporator heatsinks, clamp plate stop geometry, and beryllium copper spring flexure are novel design features that allow the wafer carrier approach to meet thermal conductance and positioning requirements in the cryogenic prober system. The cam and pusher actuator designs are also novel features but were designed more to facilitate operation with the existing stage and control wiring design. Other embodiments might incorporate specific additional actuators to support these latching movements.

Figure 7A:
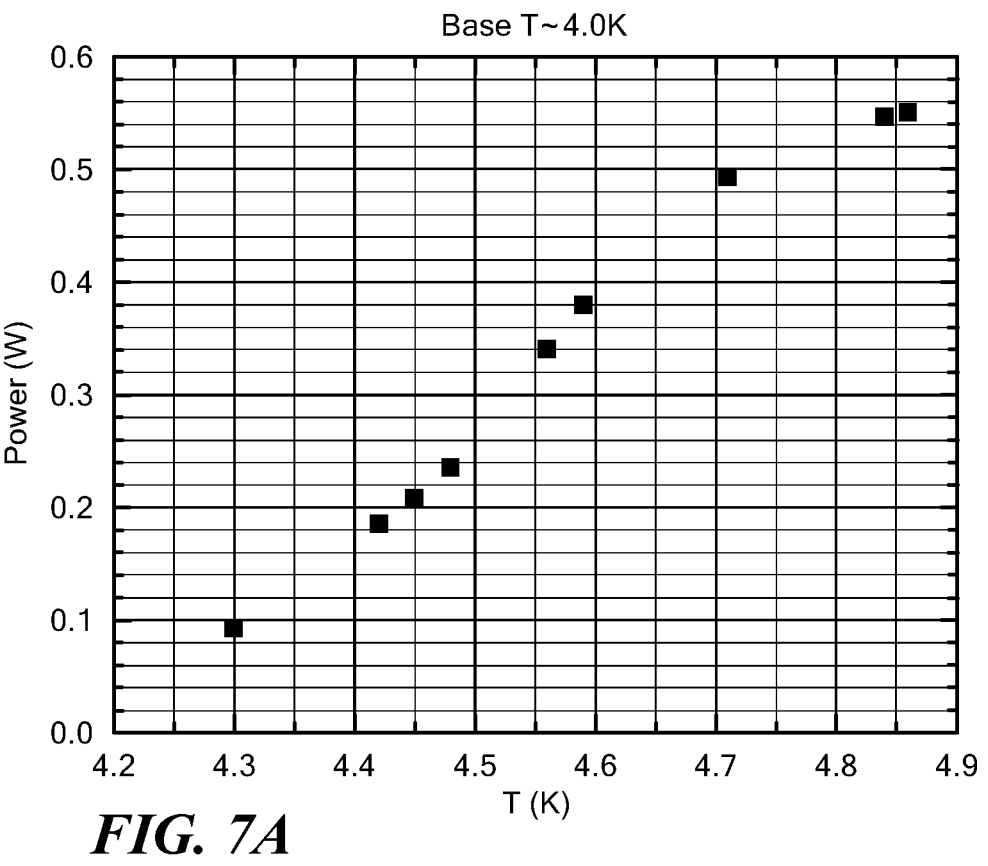
FIG. 7A is a plot of the cooled chuck thermal performance showing installed heater power absorbed by the wafer holder vs. measured sensor temperature.
Figure 7B:
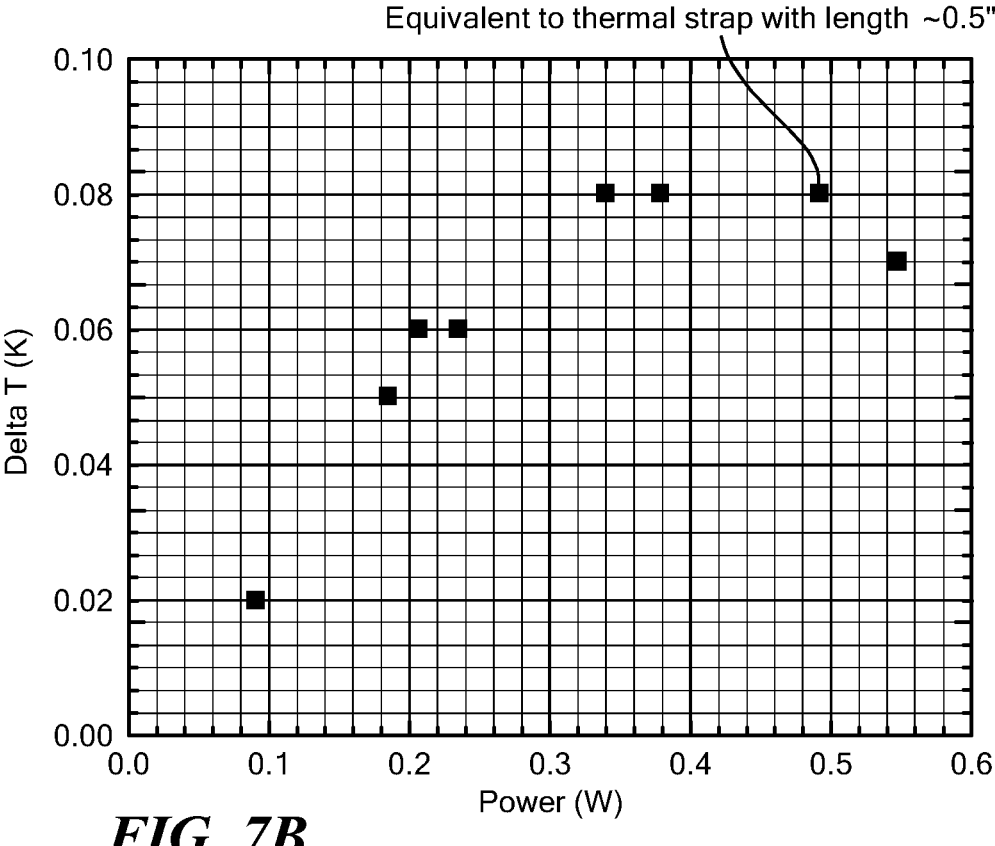
FIG. 7B is the data of FIG. 7A re-plotted to show the temperature increase (delta temperature) of the sensor relative to no applied heater power as the heater power is increased illustrating the effective thermal conductance of the convection loop cooled stage of FIG. 5B.

FIGS. 7A and 7B are plots of applied heater power vs. the chuck sensor temperature (FIG. 7A) and the sensor temperature increase relative to zero applied heater power vs. applied heater power (FIG. 7B) for a wafer chuck which may be the same as or similar to the integrated wafer chuck of FIGS. 4A-5C. FIG. 7A shows the expected wafer operating temperature when the wafer test circuitry is dissipating the indicated power level, indicating that the system should reliably provide wafer test temperatures <5° K. FIG. 7B also shows the effective thermal conductance and how it compares a 0.5-inch-long thermal strap which has the equivalent thermal conductance but no ability to accommodate the level of relative stage motion within +/−4.5" in two directions provided by the disclosed embodiment.

Figure 8:
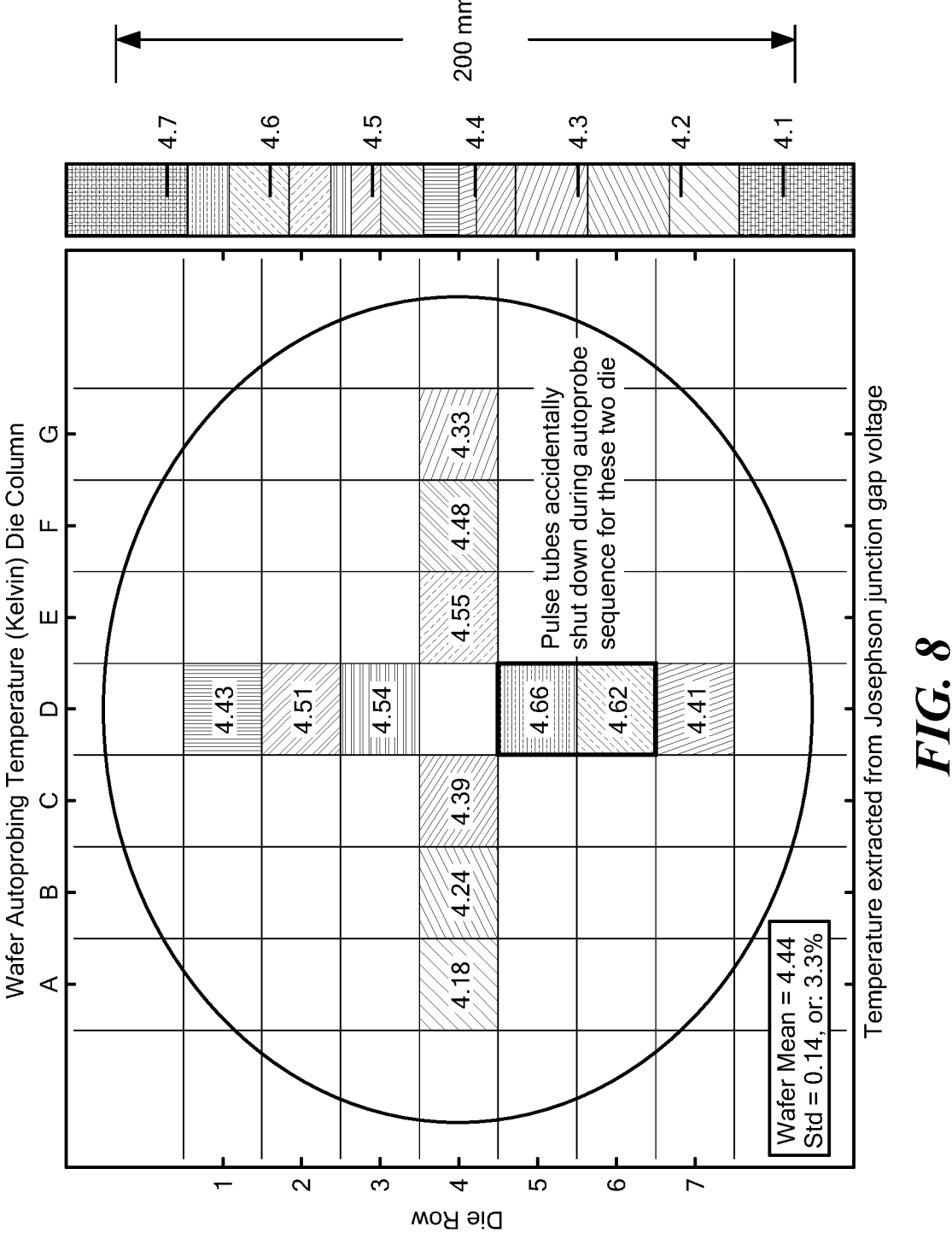
FIG. 8 is a map of wafer temperature showing the radial distribution as extracted from Josephson junction gap voltage measurements at each die position shown on the wafer.

Referring now to FIG. 8, shown is a plot (or map) of temperature on a front surface of a wafer under test as a function of die row and column positions for a probed test wafer. Prober tips were used to locally excite and test temperature sensitive circuits on the wafer. In one test, such temperature sensitive circuits comprised Josephson junctions on each individual die. The operating temperature were calculated or otherwise determined based upon known circuit parameters. Wafer temperatures are shown at twelve (12) die locations and illustrate that a cryogenic wafer prober system provided in accordance with the concepts disclosed herein (such as the system of FIG. 2) is capable of cooling a wafer from at or about room down to temperatures below 5° K and making electrical measurements at these temperatures.

Alternate Applications of Convection Loops

To promote clarity in the description and the drawings, the liquid helium convection loops and alternate embodiments disclosed herein were described in the context of a cryogenic wafer probing system. It should, however, be appreciated that utility of the liquid helium convection loops disclosed herein are not limited to cryogenic wafer probing applications. Rather, after reading the disclosure provided herein, those of ordinary skill in the art will appreciate that liquid helium convection loops as disclosed herein may find use in any applications requiring passive heat transfer in the general cryogenic temperature range, e.g., below a temperature of about 100° K, can take advantage of these natural convection-based heat transfer loops. In embodiments, these loops can use alternate cryogens, i.e. hydrogen, neon, argon, nitrogen, etc., that exhibit phase transitions at higher characteristic temperatures and different pressures as compared with helium. In embodiments, these loops can combine flexible and hard piping as required. In embodiments, these loops can be constructed within a single heat pipe based design. Cryogenic applications requiring improved compliance and effective thermal conductance relative to traditional thermal straps based on solid heat conduction will particularly benefit from this improvement.

For example, one application area in the cryogenic research space is the design of low noise, low vibration cryogenic test environments. These experiments might typically use liquid helium dewars to avoid mechanical disturbances from commercial cryo-coolers, or might design elaborate isolation methods and procedures so that commercial cryo-coolers could be used for closed-cycle cooling. In alternate embodiments of these test environments, commercial pulse-tube cryo-coolers could be used if flexible liquid helium convection loops provided vibration isolation and allowed for remote mounting of the commercial cryo-coolers. In other alternate embodiments, a common commercial cryo-cooler could be used with multiple, independent experiments connected by independent liquid helium convection loops.

Accordingly, although various embodiments of the concepts, systems, devices, structures and techniques sought to be protected are described herein with reference to the related drawings, alternative embodiments can be devised without departing from the spirit and scope of the concepts, systems, devices, structures and techniques described herein. It is noted that various connections and positional relationships, e.g., over, below, adjacent, etc., are set forth between elements in the above description and in the drawings. These connections and/or positional relationships, unless specified otherwise, can be direct or indirect, and the described concepts, systems, devices, structures and techniques are not intended to be limiting in this respect. Accordingly, a coupling of entities can refer to either a direct or an indirect coupling, and a positional relationship between entities can be a direct or indirect positional relationship.

As an example of an indirect positional relationship, references in the present description to disposing or otherwise positioning element "A" over element "B" include situations in which one or more intermediate elements (e.g., element "C") is between elements "A" and elements "B" as long as the relevant characteristics and functionalities of elements "A" and "B" are not substantially changed by the intermediate element(s).

Also, the following definitions and abbreviations are to be used for the interpretation of the claims and the specification. As used herein, the terms "comprise," "comprises," "comprising,""include," "includes," "including," "has," "having," "contains" or "containing," or any other variation thereof, are intended to cover a non-exclusive inclusion. For example, an apparatus, a method, a composition, a mixture or an article, that comprises a list of elements is not necessarily limited to only those elements but can include other elements not expressly listed or inherent to such apparatus, method, composition, mixture, or article.

Additionally, the term "exemplary" is used herein to mean "serving as an example, instance, or illustration. Any embodiment or design described herein as "exemplary" is not necessarily to be construed as preferred or advantageous over other embodiments or designs. The terms "one or more" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection".

References in the specification to "embodiments," "one embodiment, "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, relative or positional terms including but not limited to the terms "upper," "lower," "right," "left," "vertical," "horizontal," "top," "bottom," and derivatives thereof shall relate to the described structures and methods, as oriented in the drawing figures. The terms "overlying," "atop," "on top, "positioned on" or "positioned atop" mean that a first element, such as a first structure, is present on a second element, such as a second structure, where intervening elements such as an interface structure can be present between the first element and the second element. The term "direct contact" means that a first element, such as a first structure, and a second element, such as a second structure, are connected without any intermediary elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value. The term "substantially equal" may be used to refer to values that are within ±20% of one another in some embodiments, within ±10% of one another in some embodiments, within ±5% of one another in some embodiments, and yet within ±2% of one another in some embodiments.

The term "substantially" may be used to refer to values that are within ±20% of a comparative measure in some embodiments, within ±10% in some embodiments, within ±5% in some embodiments, and yet within ±2% in some embodiments. For example, a first direction that is "substantially" perpendicular to a second direction may refer to a first direction that is within ±20% of making a 90° angle with the second direction in some embodiments, within ±10% of making a 90° angle with the second direction in some embodiments, within ±5% of making a 90° angle with the second direction in some embodiments, and yet within ±2% of making a 90° angle with the second direction in some embodiments.

It is to be understood that the disclosed subject matter is not limited in its application to the details of construction and to the arrangements of the components set forth in the following description or illustrated in the drawings. The disclosed subject matter is capable of other embodiments and of being practiced and carried out in various ways.

Also, it is to be understood that the phraseology and terminology employed herein are for the purpose of description and should not be regarded as limiting. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

Accordingly, it is submitted that that scope of the patent should not be limited to the described implementations but rather should be limited only by the spirit and scope of the following claims.

All publications and references cited herein are expressly incorporated herein by reference in their entirety.

What is claimed is:

1. A system for testing superconducting and low-temperature electronic, electromagnetic, electro-optical, electro-mechanical, and other types of circuitry at a wafer level, the system comprising:
   an outer vacuum chamber,
   an inner vacuum chamber disposed within the outer vacuum chamber;
   a wafer holder disposed within the inner vacuum chamber; and
   a helium (He) convection loop thermally coupled between the wafer holder and the outer vacuum chamber, wherein the He convection loop further comprises:
   a He evaporator disposed within the inner vacuum chamber;
   a He condenser disposed external to the inner vacuum chamber; and
   He liquid and vapor flex lines in fluid communication between the He evaporator and the He condenser, wherein the He evaporator is configured to be disposed proximate to a wafer under test, and wherein the wafer holder comprises:
   a coefficient of thermal expansion (CTE) matched wafer holder thermally attached to the wafer under test,
   a wafer chuck that aligns and clamps the wafer under test, and
   a heatsink structure, integrated into the wafer chuck, and proximate to the wafer under test.

2. The system of claim 1 wherein the He evaporator is disposed proximate to the wafer holder within the inner vacuum chamber.

3. The system of claim 1 further comprising clamping means configured to provide clamping forces.

4. The system of claim 1 wherein the wafer chuck comprises one or more of:
   a metal;
   copper; and
   aluminum.

5. The system of claim 1, wherein the CTE matched wafer holder and wafer chuck are configured to allow the wafer under test to be temporarily coupled to the CTE matched wafer holder using cryogenic rated vacuum grease.

6. The system of claim 1, wherein the CTE matched wafer holder is configured to be thermally coupled to a probing structure by thermal straps to provide additional heat-sinking in a vacuum environment.

7. The system of claim 1, wherein the He evaporator is in contact with at least a surface of the wafer holder and thermally attached to the heatsink structure.

8. The system of claim 7, wherein the He liquid and vapor flex lines comprise stainless steel flex lines coupled between the He evaporator and the He condenser and configured to carry He liquid and vapor.

9. A system for testing superconducting and low-temperature electronic, electromagnetic, electro-optical, electro-mechanical, and other types of circuitry at a water level, the system comprising:

an outer vacuum chamber, an inner vacuum chamber disposed within the outer vacuum chamber;

a wafer holder disposed within the inner vacuum chamber; and a helium (He) convection loop thermally coupled between the wafer holder and the outer vacuum chamber, wherein the He convection loop further comprises:

a He evaporator disposed within the inner vacuum chamber;

a He condenser disposed external to the inner vacuum chamber; and

He liquid and vapor flex lines in fluid communication between the HE evaporator and the He condenser, wherein the He evaporator is configured to be disposed proximate to a wafer under test, and wherein the wafer holder comprises:

a coefficient of thermal expansion (CTE) matched wafer bolder thermally attached to the wafer under test, a wafer chuck that aligns and clamps the wafer under test, and a heatsink structure, integrated into the wafer chuck, and proximate to the wafer under test, wherein the He evaporator is in contact with at least a surface of the wafer holder and thermally attached to the heatsink structure.

10. The system of claim 9 wherein the He liquid and vapor flex lines comprise stainless steel flex lines coupled between the He evaporator and the He condenser and configured to carry He liquid and vapor.

11. The system of claim 9, further comprising clamping means configured to provide clamping forces.

12. The system of claim 9, wherein the CTE matched wafer holder and wafer chuck are configured to allow the wafer under test to be temporarily coupled to the CTE matched wafer holder using cryogenic rated vacuum grease.

13. The system of claim 9, wherein the CTE matched wafer holder is configured to be thermally coupled to a probing structure by thermal straps to provide additional heat-sinking in a vacuum environment.

14. A system for testing superconducting and low-temperature electronic, electromagnetic, electro-optical, electro-mechanical, and other types of circuitry at a wafer level, the system comprising:

an outer vacuum chamber;

an inner vacuum chamber disposed within the outer vacuum chamber;

a wafer holder disposed within the inner vacuum chamber; and a helium (He) convection loop thermally coupled between the wafer holder and the outer vacuum chamber, wherein the He convection loop further comprises:

a He evaporator disposed within the inner vacuum chamber;

a He condenser disposed external to the inner vacuum chamber; and

He liquid and vapor flex lines in fluid communication between the He evaporator and the He condenser, wherein the He evaporator is configured to be disposed proximate to a water under test, and wherein the wafer holder comprises:

a coefficient of thermal expansion (CTE) matched wafer holder thermally attached to the water under test, where the CTE matched wafer holder comprises a material having a coefficient of thermal expansion (CTE) which is substantially the same as the CTE of the wafer under test;

a wafer chuck that aligns and clamps the wafer under test, and a heatsink structure, integrated into the wafer chuck, and proximate to the wafer under test.

15. The system of claim 14, wherein the He evaporator is in contact with at least a surface of the wafer holder and thermally attached to the heatsink structure.

16. The system of claim 15, wherein the He liquid and vapor flex lines comprise stainless steel flex lines coupled between the He evaporator and the He condenser and configured to carry He liquid and vapor.

17. The system of claim 14, further comprising clamping means configured to provide clamping forces.

18. The system of claim 14, wherein the wafer chuck comprises one or more of:

a metal;

copper; and aluminum.

19. The system of claim 14, wherein the CTE matched wafer holder and wafer chuck are configured to allow the wafer under test to be temporarily coupled to the CTE matched wafer holder using cryogenic rated vacuum grease.

20. The system of claim 14, wherein the CTE matched wafer holder is configured to be thermally coupled to a probing structure by thermal straps to provide additional heat-sinking in a vacuum environment.

\* \* \* \* \*